United States Patent [19]
Matsuura

[11] Patent Number: 6,160,572
[45] Date of Patent: Dec. 12, 2000

[54] TUNER FOR CABLE MODEM

[75] Inventor: Syuuji Matsuura, Ikoma, Japan

[73] Assignee: Sharp Kabushiki Kaisha, Osaka, Japan

[21] Appl. No.: 08/990,716

[22] Filed: Dec. 15, 1997

[30] Foreign Application Priority Data

| Dec. 26, 1996 | [JP] | Japan | 8-347908 |
| Feb. 27, 1997 | [JP] | Japan | 9-043849 |
| Apr. 25, 1997 | [JP] | Japan | 9-108556 |

[51] Int. Cl.[7] .............................. H04N 7/10; H04N 7/14
[52] U.S. Cl. ................. 348/11; 348/12; 348/13; 348/731; 455/5.1; 455/180.4
[58] Field of Search .................. 348/11, 12, 13, 348/731; 455/5.1, 188.2, 189.1, 190.1, 191.1, 191.3, 180.2, 191.2, 180.4

[56] References Cited

U.S. PATENT DOCUMENTS

| 4,245,245 | 1/1981 | Matsumoto et al. | 380/7 |
| 4,442,548 | 4/1984 | Lehmann | 455/196.1 |
| 4,726,072 | 2/1988 | Yamashita et al. | |
| 5,204,645 | 4/1993 | Hohmann . | |
| 5,212,828 | 5/1993 | Hatashita et al. | 455/295 |
| 5,475,876 | 12/1995 | Terada et al. | |
| 5,483,209 | 1/1996 | Takayama . | |

FOREIGN PATENT DOCUMENTS

| 0348697A2 | 1/1990 | European Pat. Off. . |
| 0429914A2 | 6/1991 | European Pat. Off. . |
| 0457932A1 | 11/1991 | European Pat. Off. . |
| 0624039A2 | 11/1994 | European Pat. Off. . |
| 0851580A1 | 7/1998 | European Pat. Off. . |
| 19639237-A1 | 3/1997 | Germany . |
| 9093152 | 4/1997 | Japan . |

OTHER PUBLICATIONS

H. Holmann, ICs for Television and Video–Recorder Tuners: TUA 2017 and SDA 3302, Siemens Components XXV, No. 2, pp. 65–69, May 1990.

S.M. Liew et al.: "Single Wide Band VCO for Rx and TX"—Motorola Technical Developments, vol. 10, Mar. 1, 1990, p. 122.

Nico Baars: "ICs and Discrete Semiconductors for TV and VCR Tuners" Electronic Components and Applications., vol. 9 No. 4, 1989, Eindhoven NL, pp. 240–252.

H. Hohmann et al.: "ICS For Television and Video–Recorder Tuners: TUA 2017 and SDA 3302" Siemens Components, vol. 25, No. 2, May 1990, pp. 65–69.

*Primary Examiner*—Andrew I. Faile
*Assistant Examiner*—Sam Huang

[57] ABSTRACT

Input CATV signals are received by a PIN diode where the signals are high frequency signals of a plurality of frequency bands including UHF band, VHF•HIGH band and VHF•LOW band, the respective selected high frequency signals are tuned to predetermined frequency by radio frequency input tuning circuit, amplified by radio frequency amplifying circuit, and tuned to a signal of a prescribed frequency by radio frequency output tuning circuit. The high frequency signal is converted to an intermediate frequency signal based on a local oscillation signal from a local oscillation circuit by means of a mixer circuit, and applied to an intermediate frequency amplifying circuit.

4 Claims, 18 Drawing Sheets

TUNER FOR CABLE MODEM

BACKGROUND OF THE INVENTION

1. Field of the Invention

The present invention relates to a tuner for a cable modem, used for a cable modem enabling high speed data communication at home utilizing a channel, which is not used, of a cable television.

2. Description of the Background Art

For cable television (hereinafter simply referred to as CATV), a so-called HFC (Hybrid Fiber/Coax) has been introduced in which main network is implemented by optical fibers while coaxial cable is still used as incoming line to the distributor. This introduction is to provide broad band data communication service of several M bits/sec. to ordinary homes. It is possible to provide a high speed data line having transmission speed of 30 Mbits/sec. with the band width of 6 MHz simply by using 64 QAM (Quadrature Amplitude Modulation), which is no longer the state of the art. Cable modem is used for such application. Utilizing a channel not used of CATV, high speed data communication of 4 Mbits/sec. to 27 Mbits/sec. is possible.

FIG. 18 is a block diagram of a conventional example of a tuner for a cable modem. CATV signals include an upstream signal transmitted to a station having frequency of 5 MHz to 42 MHz and a downstream signal transmitted from the station to a tuner for a cable modem having the frequency of 54 MHz to 860 MHz, and the signals are connected to a cable circuit through an input terminal 11 of the tuner. The upstream signal transmitted from the cable modem is received by a data receiver of the CATV station (system operator) and enters a computer of the station. A data signal which has been subjected to quadrature phase shift keying (QPSK) from a QPSK transmitter is input to a data terminal 10 of the cable modem as an upstream signal. The data signal is past to an upstream circuit 9 and a CATV input terminal 11 to be transmitted to the CATV station.

A data signal received at the CATV station is subjected to 64 QAM modulation and transmitted to a cable circuit, and enters through a CATV input terminal 11 to the cable modem, as a downstream signal. In the modem, a desired signal is selected by a tuner, the signal is subjected to 64 QAM demodulation, MPEG reproduction and processing at a CPU (Central Processing Unit), and the resulting data signal is provided to a computer connected to the modem.

Processing of the downstream signal in the tuner is as follows. A downstream signal input to CATV input terminal 11 is passed through a broad band amplifying circuit 1 and converted to a first intermediate frequency (IF) signal having the frequency of 950 MHz by a first local mixer circuit 2 and a first local oscillation circuit 7. Oscillation frequency of the first local oscillation circuit 7 is microcomputer-controlled by a PLL (Phase-Locked Loop) channel selection circuit 13. The IF signal converted to the first intermediate frequency is tuned by a first IF input tuning circuit 3 and amplified by a first IF amplifying circuit 4, channel selection is performed in a first IF output tuning circuit 5, and thereafter the signal is introduced to a second mixer circuit 6.

In the second mixer circuit 6, the first IF signal is converted to a second IF signal by a second local oscillation circuit 8, and the converted second IF signal is provided to an IF output terminal 12. The second local oscillator circuit 8 is under PLL control by PLL channel selection circuit 13 as is the first local oscillation circuit 7. Generally, 44 MHz is applied as the second intermediate frequency. The second IF signal output from a tuner output terminal is subjected to conversion to 5 MHz base line, A/D conversion, 64 QAM demodulation and MPEG processing, and thereafter, the resulting signal is provided as the data signal.

The tuner for a cable modem is always kept at a standby state for reception. Therefore, low power consumption is required. However, in the conventional double conversion type tuner for the cable modem, power consumption in the standby state is as much as 1 to 2 W which is considerably large as compared with power consumption during operation. Especially power consumption in the first mixer circuit 2 and first local oscillation circuit 7 is as high as about 70% of the entire power consumption.

In the conventional circuit described above, the double conversion method using two circuits, that is, first local oscillation circuit 7 and second local oscillation circuit 8, it becomes necessary to prevent interference between these circuits, and therefore it becomes necessary that the box design ensures strict electrical shielding. Further, the chassis must be designed such that there is sufficient space to further reduce interference. Accordingly, the outer shape becomes large and local spurious disturbance is more likely because of interference between the local oscillators, which results in higher possibility of communication error.

Further, in the conventional example, the input circuit for the IF amplifying circuit is not such a tuning circuit that tunes only to the desired signal but it is a broad band amplifying circuit 1. Therefore, when there is full wave input of CATV signals, distortion caused by radio interference is likely. It becomes difficult to increase power gain and to decrease noise figure, which means that there is higher possibility of communication error.

Further, since the first local oscillation frequency is in the band of 1 GHz to 2 GHz, it is difficult to improve microphonic noise and phase noise of the oscillator as a VCO (Voltage Controlled Oscillator). This results in communication error (deterioration of BERT) in the products.

SUMMARY OF THE INVENTION

Therefore, an object of the present invention is to provide a tuner suitable for a cable modem which is always kept in the standby state for reception, which tuner consumes less power by adopting single conversion method.

Another object of the present invention is to provide a compact and light tuner for a cable modem allowing simplification of shielding structure and not requiring much space and distance between circuit elements as it is less susceptible to communication error.

Briefly stated, in the tuner in accordance with the present invention, an upstream circuit for transmitting data is connected to an upstream side of the CATV station, a filter circuit for removing data for the upstream side is connected to a downstream side, signals received as inputs having different frequencies are applied from an output from the filter circuit to a selecting circuit, at least two groups of signals received as inputs are selectively output from the selecting circuit in accordance with frequency bands, respective groups of signals are tuned to predetermined frequencies respectively by an RF tuning circuit, converted to intermediate frequency signals by a frequency conversion circuit, and amplified by IF amplifying circuit.

Therefore, according to the present invention, as the single conversion method is employed, a tuner which consumes less power and therefore is suitable for a cable modem which is always kept in the standby state for reception is obtained. Further, unlike the one employing double conversion method, there is not an interference between local oscillation circuits and therefore not a communication error caused by local spurious disturbance. Accordingly, shielding structure can be simplified, space between circuit elements need not be large, and therefore the tuner can be made compact and light.

More preferably, an RF tuning circuit and a frequency conversion circuit corresponding to a frequency band selected by the selection circuit only are operated, and operations of RF tuning circuit and frequency converting circuit corresponding to other frequency band are stopped.

More preferably, each RF tuning circuit includes an RF input tuning circuit for tuning a selected received signal to a predetermined frequency, an RF amplifying circuit for amplifying an output signal from the RF input tuning circuit, and an RF output tuning circuit for tuning an output signal from the RF amplifying circuit to a predetermined frequency.

Each frequency conversion circuit includes a local oscillation circuit for generating a local oscillation signal, and a mixer circuit for converting an output signal from the RF tuning circuit based on the local oscillation signal generated by the local oscillation circuit.

The selecting circuit includes a PIN diode, and an automatic gain control voltage for controlling gain is applied to an anode of the PIN diode. The RF amplifying circuit includes a dual gate type MOSFET receiving at a first gate the output signal from the RF input tuning circuit, and at a second gate, the automatic gain control voltage for controlling the gain.

More preferably, an attenuator for attenuating level of the signal received as an input is provided on an input side of the selecting circuit, and the automatic gain control voltage for controlling gain is applied to the attenuator.

More preferably, selecting circuit selectively outputs three groups of received signals of a first frequency band, a second frequency band having higher frequency than the frequency band and a third frequency band having higher frequency than the first and second frequency bands, and the RF amplifying circuit and frequency converting circuit are provided for each of the three frequency bands.

In another embodiment, the selecting circuit selectively outputs two groups of received signals of the first and second frequency bands and the third frequency band, of the first frequency band, the second frequency band having higher frequency than the first frequency band and the third frequency band having higher frequency than the first and second frequency bands, the RF input tuning circuit includes a switching circuit for switching between first and second tuning circuits corresponding to the first and second frequency bands respectively, and the RF output tuning circuit includes a switching circuit for switching tuning circuits corresponding to the first and second frequency bands respectively.

The RF input tuning circuit for the third frequency band is provided with: a tuning circuit including a high pass filter, a tuning coil, a variable capacitance element and a tuning voltage applying circuit; a variable capacitance diode for impedance matching; and a bias circuit.

The RF input tuning circuit for each of the first and second frequency bands includes a double tuning type input circuit, an impedance matching element and a bias circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
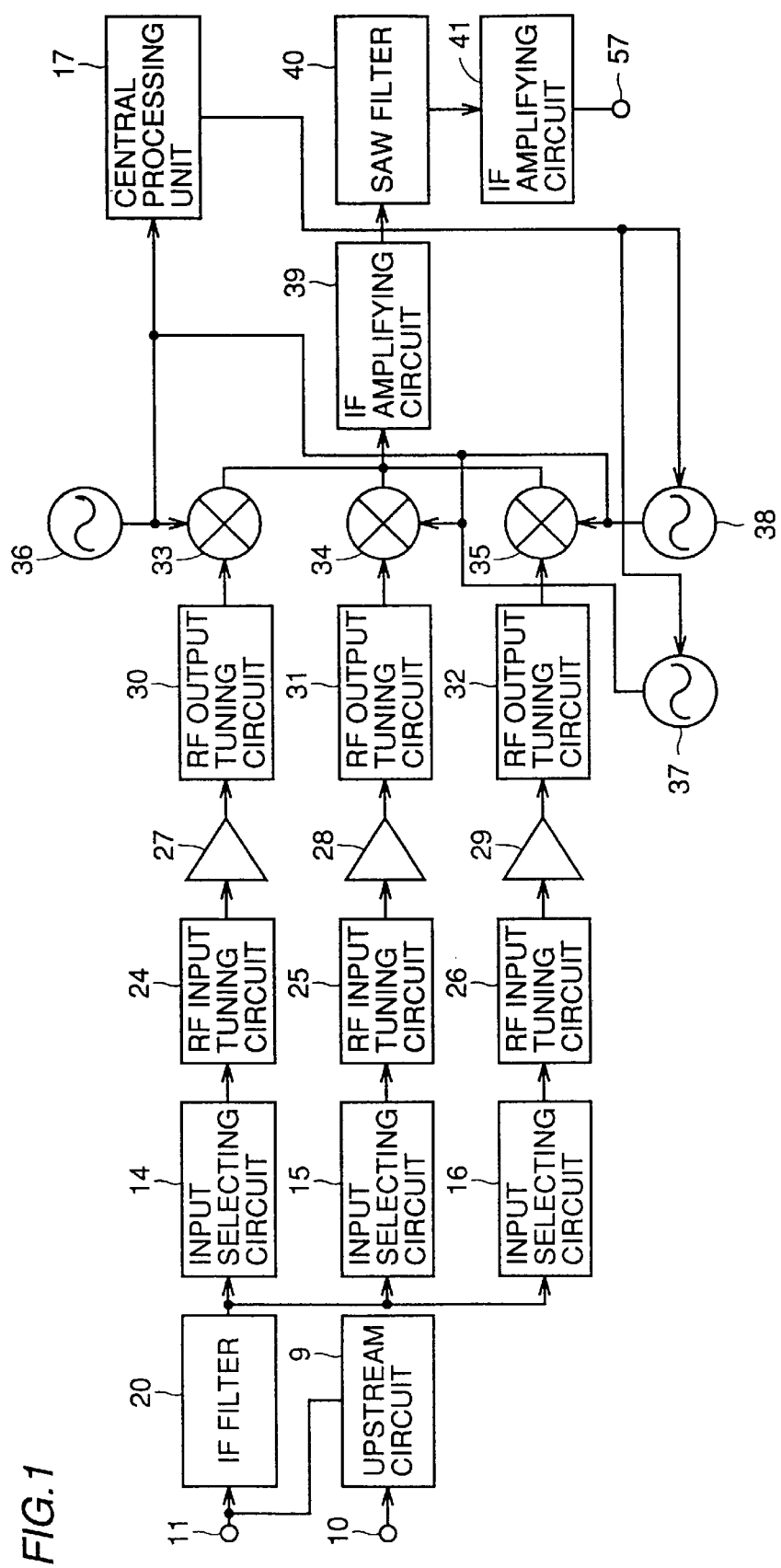
FIG. 1 is a block diagram of a first embodiment of the present invention.

FIG. 1 is a block diagram showing a first embodiment of the present invention. QPSK modulated data signals supplied from data terminal 10 as an upstream signals are passed through upstream circuit 9 and supplied to CATV input terminal 11, and transmitted to the CATV station. Meanwhile, downstream signals supplied from CATV input terminal 11 are passed through a high pass filter 20, and input to input selecting circuit 14, 15 and 16 and switched to circuit of a UHF band, VHF•HIGH band and a VHF•LOW band, respectively.

High pass filter 20 has attenuation range of 5 to 46 MHz and a pass band of 54 MHz or higher. The UHF band refers to 470 to 860 MHz, VHF•HIGH band refers to 170 to 470 MHz and the VHF•LOW band refers to 54 to 170 MHz. However, the ranges are not specifically defined. As for the method of switching input selecting circuit 14, 15 and 16, generally a method utilizing a switching diode, or a method employing a filter utilizing band width division is used. In the present embodiment, the method utilizing a switching diode is adopted.

Each of the bands are set to an operative state in accordance with the received channel, and remaining bands are set to inoperable state. For example, when a UHF band channel is received, input selecting circuit 14, an RF input tuning circuit 14, an RF amplifying circuit 27, an RF output tuning circuit 30, a mixer circuit 33 and a local oscillation circuit 36 for the UHF band are set to the operative state, while input selecting circuits 15 and 16, RF input tuning circuits 25 and 26, RF amplifying circuits 28 and 29, RF output tuning circuits 31 and 32, mixing circuits 34 and 35, and local oscillation circuits 37 and 38 for the VHF•HIGH band and the VHF•LOW band, respectively, are set inoperative.

Similarly, when the VHF•HIGH band is received, input selecting circuit 15, RF input tuning circuit 25, RF amplifying circuit 28, RF output tuning circuit 31, mixer circuit 34 and local oscillation circuit 37 for the VHF•HIGH band are set to the operative state, while operations of input selecting circuits 14 and 16, RF input tuning circuits 24 and 26, RF amplifying circuits 27 and 29, RF output tuning circuits 30 and 32, mixer circuits 33 and 35 and local oscillation circuits 36 and 38 for the UHF band and the VHF•LOW band are stopped.

When the VHF•LOW band is received, input selecting circuit 16, RF input tuning circuit 26, RF amplifying circuit 29, RF output tuning circuit 32, mixer circuit 35 and local oscillation circuit 38 for the VHF•LOW band are set to the operative state, while operations of input selecting circuits 14 and 15, RF input tuning circuits 24 and 25, RF amplifying circuits 27 and 28, RF output tuning circuits 30 and 31, mixer circuits 33 and 34, and local oscillation circuits 36 and 37 for the UHF band and the VHF•HIGH band are stopped.

Common circuitry including upstream circuit 9, high pass filter 20, IF amplifying circuits 39 and 41, an SAW (Surface Acoustic Wave) filter 40 and CPU 17 are always set to the operative state regardless of switching between bands. The series of operation occur as channel selection data is transmitted from CPU 17 to PLL channel selection circuit. When a channel is selected based on the channel selection data, input selecting circuit 14, 15 or 16 operates in accordance with band information selected simultaneously with channel selection, and power supply to circuitry for respective band is switched.

The operation for each band will be described. As already described above, the CATV signals pass through high pass filter 20 and thereafter enter input selecting circuits 14, 15 and 16, where band switching takes place. Respective outputs are provided to RF input tuning circuits 24, 25 and 26, where the outputs are tuned with the channels, respectively. The tuned signals are amplified by RF amplifying circuits 27, 28 and 29, supplied to RF output tuning circuits 30, 31 and 32, where received signals are output.

Thereafter, the selected received signals are converted to IF signals by mixer circuits 33, 34 and 35 and local oscillation circuits 36, 37 and 38, amplified by IF amplifying circuit 39, passed through SAW filter 40, and again amplified by IF amplifying circuit 41, and thereafter output as an IF output, from IF output terminal 57.

Figure 18:
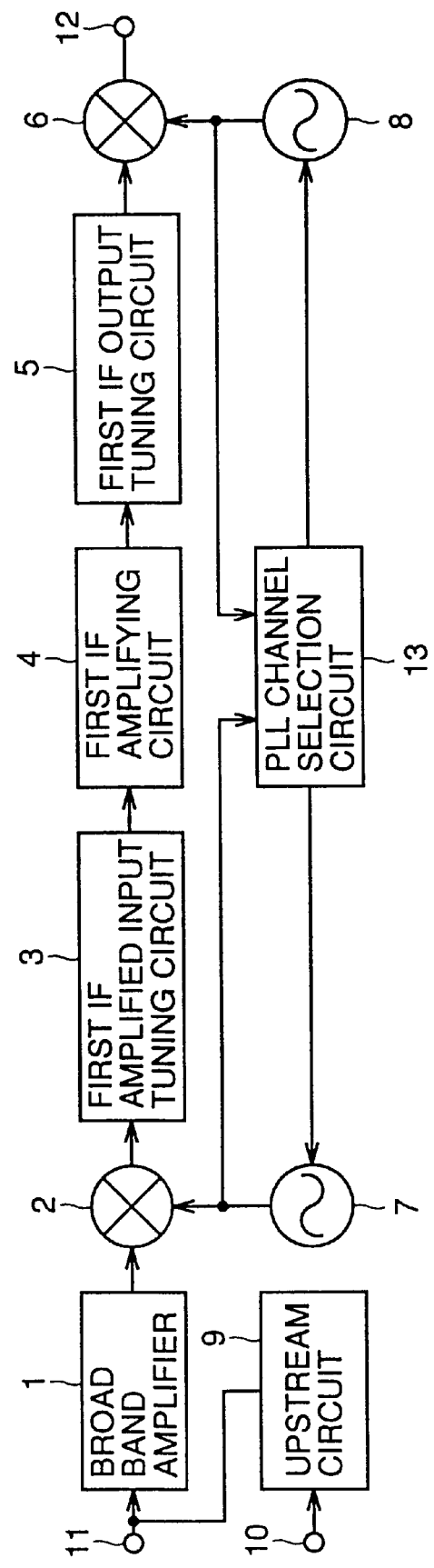
FIG. 18 is a block diagram of a tuner of a conventional example.

In the prior art shown in FIG. 18, multiwave signals as the CATV signals are received at broad band amplifying circuit 1, and therefore distortion is highly likely. In order to solve this problem, it is necessary to cause much current to flow in the amplifier device. Further, since first mixer circuit 2 requires local oscillation signal of at least +10 dB$\mu$, much current is necessary for the circuit amplifying the local oscillation signal from first local oscillation circuit 7.

In the above described first embodiment, tuning circuits are provided in RF input tuning circuits 24, 25 and 26 which are input circuit for the RF amplifying circuits, for receiving desired signals. Therefore, the multiwave signals are not directly applied to the amplifying circuit, and therefore distortion can be suppressed. As a result, it becomes unnecessary to cause much current to flow. In the prior art example shown in FIG. 18, power gain is set to a low value of around 10 dB$\mu$ in order to suppress distortion in broad band amplifying circuit 1. By contrast, according to the first embodiment, since a tuning circuit is provided in the input circuit, it becomes easier to set higher gain while suppressing distortion, and as a result, noise can be lowered.

As the frequency converting circuit is formed as one circuit for each band, local spurious caused by interference between oscillation circuits is not experienced, different from the conventional double conversion method shown in FIG. 18. Therefore, it is unnecessary to ensure space between circuit arrangements and to provide shielding to prevent interference, Accordingly, the outer shape can be made compact and the shielding structure can be simplified.

Further, in the prior art shown in FIG. 18, local oscillation frequency of first local oscillation circuit 7 is as high as 1 to 2 GHz, and therefore phase noise and microphonic noise of the VCO (Voltage Controlled Oscillator) tend to occur. However, in the first embodiment, local oscillation frequencies of local oscillation circuits 36, 37 and 38 have only to be higher by the intermediate frequency than the received frequencies. Accordingly, the phase noise, microphonic noise and so on can be suppressed.

Figure 2:
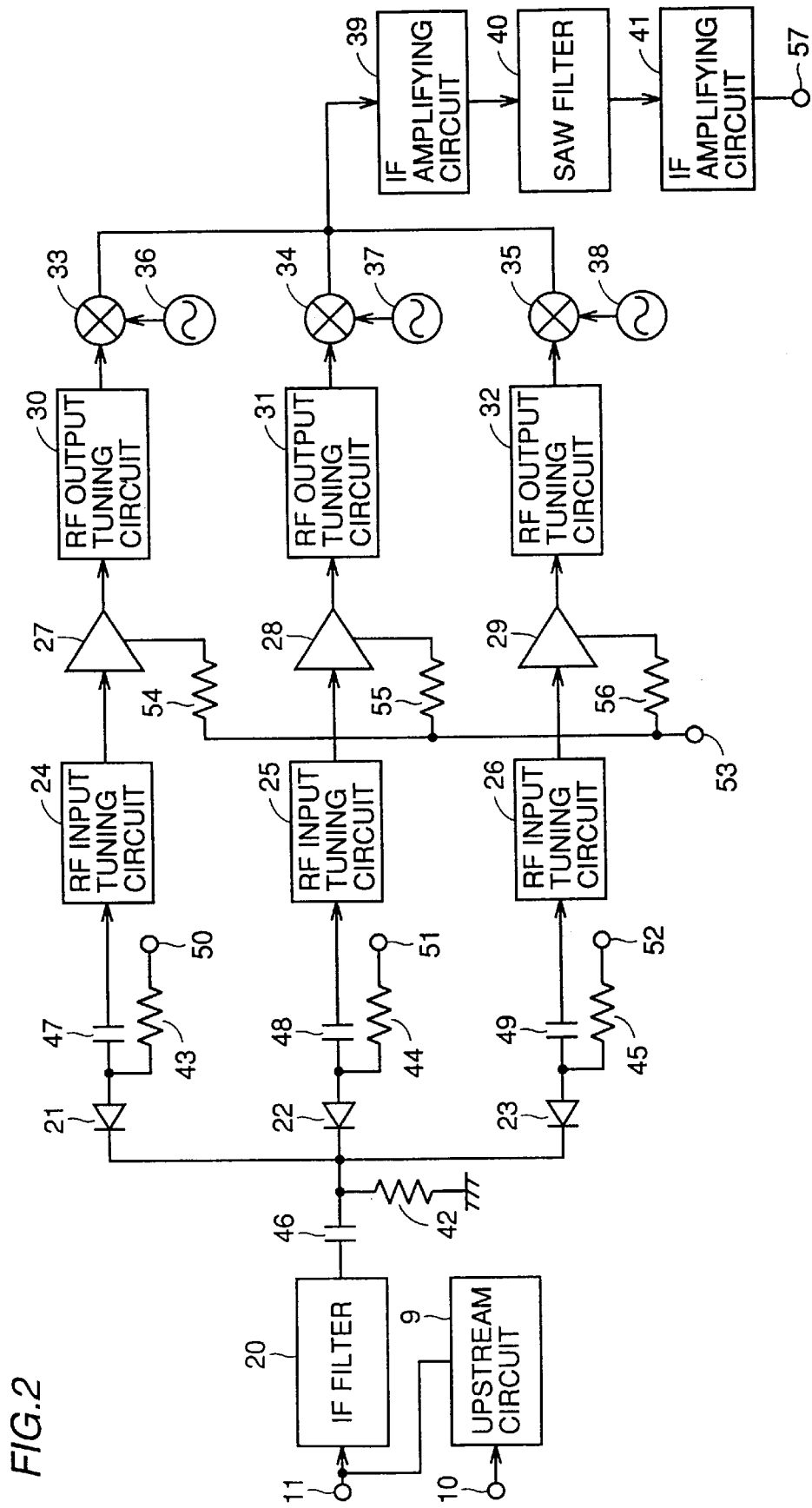
FIG. 2 is a circuit diagram of a second embodiment of the present invention.

FIG. 2 is a circuit diagram showing a second embodiment. Prior to the description of the present embodiment, details of the first embodiment will be described again, in order to clarify difference between the first and second embodiments. According to the first embodiment described above, the tuner for a cable modem is divided into a UHF band (B3 band) receiving signals between the frequency of 470 to 860 MHz, a VHF•HIGH band (B2 band) receiving signals having frequencies of 170 MHz to 470 MHz, and a VHF•LOW band (B1 band) receiving signals having frequencies of 54 to 170 MHz, and has a receiving circuit for each band. However, band division may be arbitrarily set and not limited to the one described above.

Downstream signals pass through IF filter (high pass filter) 20 and enter to an input switching circuit and switched to respective circuitry of the UHF band, VHF•HIGH band and VHF•LOW band. IF filter 20 is a high pass filter having attenuation range of 5 to 46 MHz and a pass band of at least 54 MHz. The respective bands described above are selectively set to the operative state in accordance with the received channel, and non-selected bands are set to inoperative state.

For example, when a channel of the UHF band is received, function of a circuitry including PIN diode 21, RF input tuning circuit 24, RF amplifying circuit 27, RF output tuning circuit 30, mixer circuit 33, local oscillation circuit 36, IF amplifying circuit 39, SAW filter 40 and IF amplifying circuit 41 is set to the operative state, while operations of the VHF•HIGH band and VHF•LOW band circuits including PIN diodes 22 and 23, RF input tuning circuits 25 and 26, RF amplifying circuits 28 and 29, RF output tuning circuits 31 and 32, mixer circuits 34 and 35 and local oscillation circuits 37 and 38, respectively, is stopped.

The state of operation of each of said bands will be described. The CATV signals are selected by an input switching circuit including PIN diodes 21, 22 and 23, resistors 42, 43, 44 and 45, capacitors 46, 47, 48 and 49 and power supply terminals 50, 51 and 52 supplying power supply voltages +B1, +B2 and +B3 for respective bands, and thereafter passed to RF input tuning circuits 24, 25 and 26, amplified by RF circuits 27, 28 and 29 and to RF output tuning circuits 30, 31 and 32, from which the received signals are output. The signal output from RF output tuning circuits 30, 31 and 32 has its frequency converted by mixer circuits 33, 34 and 35 and by local oscillation circuits 36, 37 and 38, passed to IF amplifying circuit 39 and to SAW filter 40, thereafter again amplified by IF amplifying circuit 41, and provided to IF output terminal 57. The operation is common to all the bands.

The input switching circuit is supplied with power from power supply terminals 50, 51 and 52 when the corresponding bands are in the operative state. When the UHF band is received, the voltage +B1 is applied to power supply terminal 50, bias is provided by bias resistors 43 and 42 to PIN diode 21 so that it is turned ON, and the UHF signal is passed. Meanwhile, since power is not supplied to power supply terminals 51 and 52 for the VHF•HIGH band and VHF•LOW band, PIN switching diodes 22 and 23 are OFF, and therefore the signals of these bands are not passed. The operation is common to all the bands.

An RF AGC voltage supplied to an AGC terminal 53 is applied to the second gate of RF amplifying circuits 27, 28 and 29 through bias resistors 54, 55 and 56. Generally, a dual gate MOSFET is used for RF amplifying circuits 27, 28 and 29 of which first gate is supplied with an input signal, and the second gate receives a reverse AGC voltage.

As described above, in the tuner for a cable modem shown in FIG. 2, a dual gate MOSFET element is applied to RF amplifying circuits 27, 28 and 29, the first gate of which receives the input signal and the second gate of which receives the AGC voltage. Therefore, when the input signal level is not higher than 60 dBμ, it operates with full gain and when the input signal level exceeds 60 dBμ, a DC voltage is applied to AGC terminal 53 so that the output level of the tuner is always kept at a constant level. The DC voltage is applied to the second gate of the dual gate MOSFET, and the function that power gain of the RF amplifying circuit is decreased when a DC voltage is applied in the reverse direction is provided.

The CATV signals include a large number of signals of about 100 channels, and signals of one same level are input simultaneously to input terminal 11 of the tuner. The input signals are passed to RF input tuning circuits 24, 25 and 26 from which desired signals are output, which signal are applied to the first gate of dual gate MOSFET constituting RF amplifying circuits 27, 28 and 29. However, when the input signal level exceeds 60 dBμ, possibility of inter modulation such as CSO (Composite Second Order Beat) and CTB (Composite Triple Beat) and possibility of cross modulation are higher.

Figure 3:
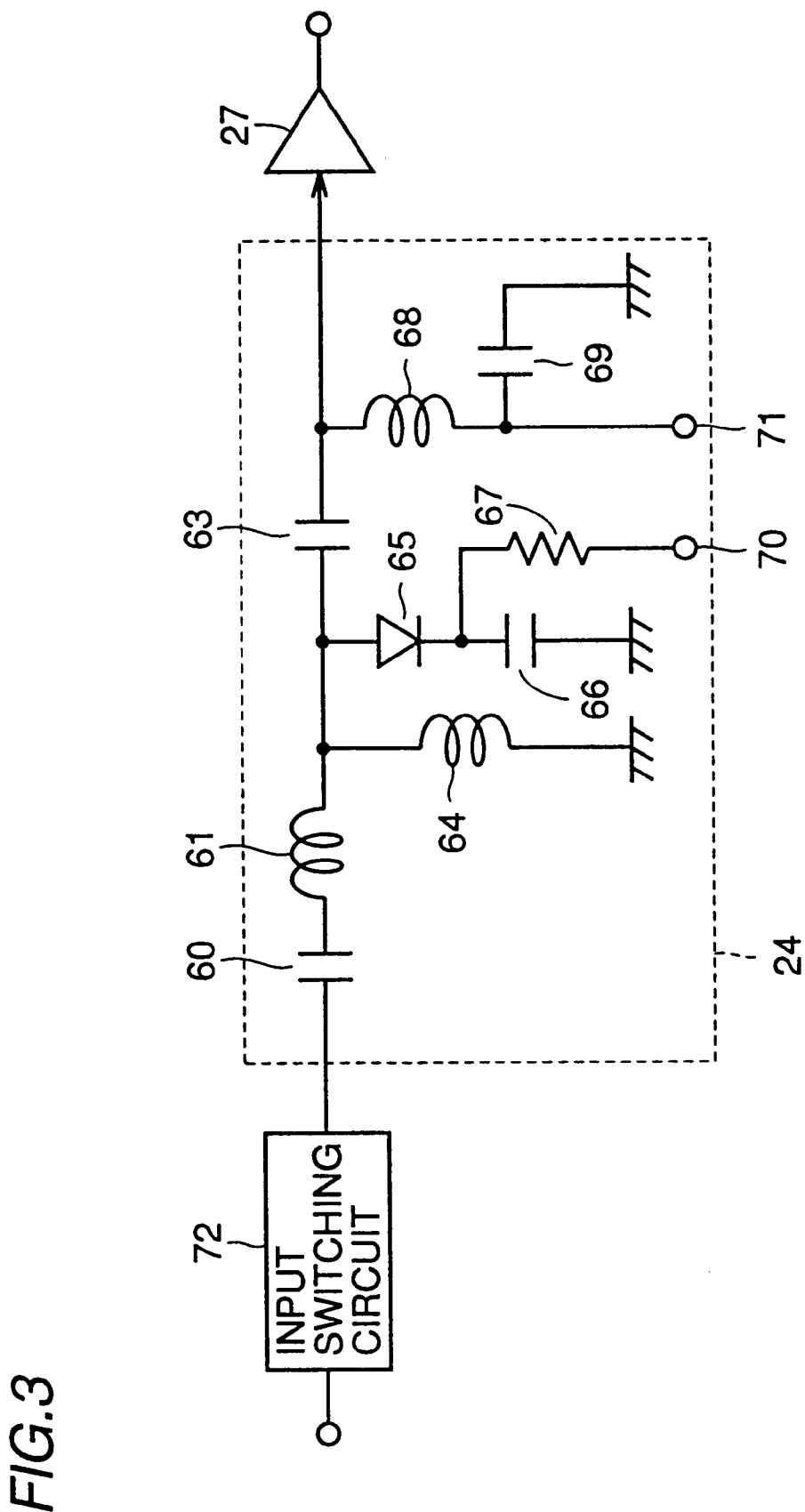
FIG. 3 is a circuit diagram showing an example of the RF input tuning circuit of the embodiment shown in FIG. 2.

Referring to FIG. 2, RF input tuning circuit 24 for the UHF band is as shown in FIG. 3. Referring to FIG. 3, impedance matching between input signal switching circuit 72 of the preceding stage and an RF amplifying circuit 27 and RF input tuning circuit 24 of the succeeding stage is attained by DC cut capacitors 60, 63 and an impedance matching coil 61 connected in series. Further, a tuning circuit is formed by a tuning coil 64, a variable capacitance diode 65, and a capacitor 66 for suppressing capacitance variation ratio. A tuning point of the tuning circuit is adjusted by a tuning voltage supplied to variable capacitance diode 65 from terminal 70 through bias resistor 67.

To RF amplifying circuit 27 of the succeeding stage, A prescribed bias voltage of the UHF band is supplied from terminal 71 through an RF choke coil 68. A bypass capacitor 69 is connected to terminal 71. Generally, a dual gate MOSFET is used for RF amplifying circuit 27 of which first gate receives an input signal and the second gate receives a reverse AGC voltage.

In RF input tuning circuit 24 having the structure shown in FIG. 3, the bias to RF amplifying circuit 27 of the succeeding stage is supplied through RF choke coil 68. Therefore, by the input capacitance of RF choke coil 68 and the input capacitance of RF amplifying circuit 27 of the succeeding stage, a resonator circuit is formed. Since the resonator circuit is adapted to resonate around 400 MHz, it is susceptible to the influence of disturbing signals, when the desired signals are received. This problem is solved by the fourth embodiment, which will be described later.

In the RF input tuning circuit having the structure shown in FIG. 3, when multiwave CATV input signals are applied at strong signal level of 75 dBμ or higher, possibility of inter modulation and cross modulation in variable capacitance diode 65 becomes higher.

Figure 4:
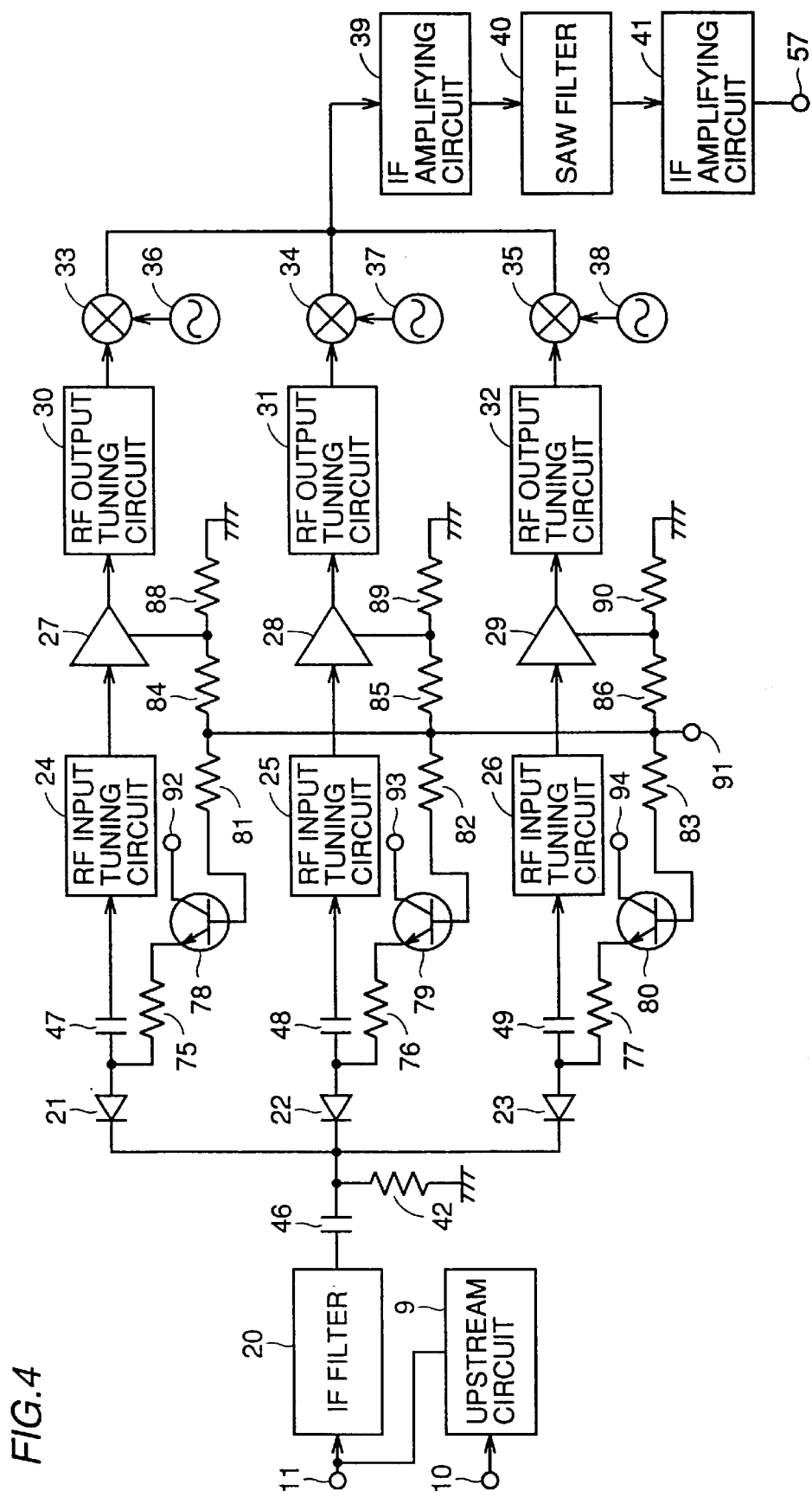
FIG. 4 is a circuit diagram showing a third embodiment of the present invention.

FIG. 4 is a circuit diagram of the third embodiment, in which portions corresponding to FIG. 2 are denoted by the same reference characters and description thereof is not repeated. In the second embodiment, input selecting circuits 14, 15 and 16 of respective bands shown in FIG. 1 are formed by PIN diodes 21, 22 and 23, which PIN diodes 21, 22 and 23 are controlled by the AGC voltage together with RF amplifying circuit 27 of the succeeding stage, so as to improve characteristic related to nonlinear distortion of the RF amplifying circuit.

Referring to FIG. 4, for the UHF band, there are PIN diode 21, DC cut capacitor 47, RF input tuning circuit 24, RF amplifying circuit 27, RF output tuning circuit 30, mixer circuit 33, local oscillation circuit 36, bias resistors 75 and 88, AGC bias resistors 81 and 84, and an NPN transistor 78.

For the VHF•HIGH band, there are PIN diode 22, DC cut capacitor 48, RF input tuning circuit 25, RF amplifying circuit 28, RF output tuning circuit 31, mixer circuit 34, local oscillation circuit 37, bias resistors 76 and 89, AGC bias resistors 82 and 85, and an NPN transistor 79.

Further, for the VHF•LOW band, there are PIN diode 23, DC cut capacitor 49, RF input tuning circuit 26, RF amplifying circuit 29, RF output tuning circuit 32, mixer circuit 35, local oscillation circuit 38, bias resistors 77, 90, AGC bias resistors 83 and 89, and an NPN transistor 80. High pass filter 20, upstream circuit 9, IF amplifying circuits 39 and 41 and SAW filter 40 are provided common to the respective bands.

The CATV input signals are input to input terminal 11, passed through high pass filter (HPF) 20 which removes upstream signals having the frequency of 5 to 45 MHz, passed through DC cut capacitor 46 and applied to PIN diodes 21, 22 and 23. As is well known, PIN diodes 21, 22 and 23 are often used for an attenuator circuit, utilizing the characteristic that RF resistance changes when current is controlled in the direction from the anode to the cathode.

In the present embodiment, bias is supplied to PIN diodes 21, 22 and 23 by bias resistors 42, 75, 76 and 77, and the current is controlled by NPN transistors 78, 79 and 80. The bias voltage to be applied to PIN diodes 21, 22 and 23 is supplied from power supplies 92, 93 and 94. NPN transistors 78, 79 and 80 are controlled by the AGC voltage supplied from AGC terminal 91 through resistors 81, 82 and 83.

Therefore, selection of each band is possible by changing bias voltage to be supplied to PIN diodes 21, 22 and 23. For example, when the power is applied to power supply 92, PIN diode 21 is biased, and therefore circuitry for the UHF band operates. At this time, power supplies 93 and 94 are controlled such that the voltage is not applied thereto. Therefore, PIN diodes 22 and 23 come to have infinite resistance, and therefore circuitry for the VHF•HIGH band and the circuitry for the VHF•LOW band are set to the OFF state. The same applies to cases when the circuitry for the VHF•HIGH band or the circuitry for the VHF•LOW band is selectively operated.

The CATV signals are controlled by PIN diodes 21, 22 and 23, passed to DC cut capacitors 47, 48 and 49, and supplied to RF input tuning circuits 24, 25 and 26. The CATV signals input to RF input tuning circuits 24, 25 and 26 are tuned to the desired signals, amplified by RF amplifying circuits 27, 28 and 29, converted to IF signals by local oscillation circuit 36, 37 and 38 as well as mixer circuits 33, 34 and 35, and output to IF amplifying circuit 39. Circuit elements following IF amplifying circuit 39 operate in the similar manner as in the prior art.

Next, delayed AGC will be described. In the third embodiment of the present invention, in order to improve characteristic related to distortion in RF amplifying circuit, AGC bias is set such that AGC operation for PIN diodes 21, 22 and 23 takes place earlier than the AGC operation for RF amplifying circuits 27, 28 and 29. Consequently, it becomes possible to set the CATV signals input to RF amplifying circuits 27, 28 and 29 to the input level where distortion occurs. As for the bias setting of AGC, it is set to the RF•AGC operation start point by bias resistors 42, 75, 76 and 77 of PIN diodes 21, 22 and 23.

Thereafter, the AGC voltage is set by bias resistors 84, 88, 85, 89, 86 and 90 such that AGC operation for RF amplifying circuits 27, 28 and 29 takes place in accordance with the amount of gain attenuation of PIN diodes 21, 22 and 23. For example, if RF•AGC operation is to be performed when the CATV signal has the input level of 60 to 90 dBμ, then the bias of PIN diodes 21, 22 and 23 is set such that AGC operation is started at 60 dBμ. Thereafter, values of AGC bias resistors 84, 85 88, 89, 86 and 90 are determined such that AGC operation for RF amplifying circuits 27, 28 and 29 starts when the input level attains to 75 dBμ, assuming that the amount of gain attenuation of PIN diodes 21, 22 and 23 is −15 dB, and in this manner, desired AGC bias is set.

Figure 5:
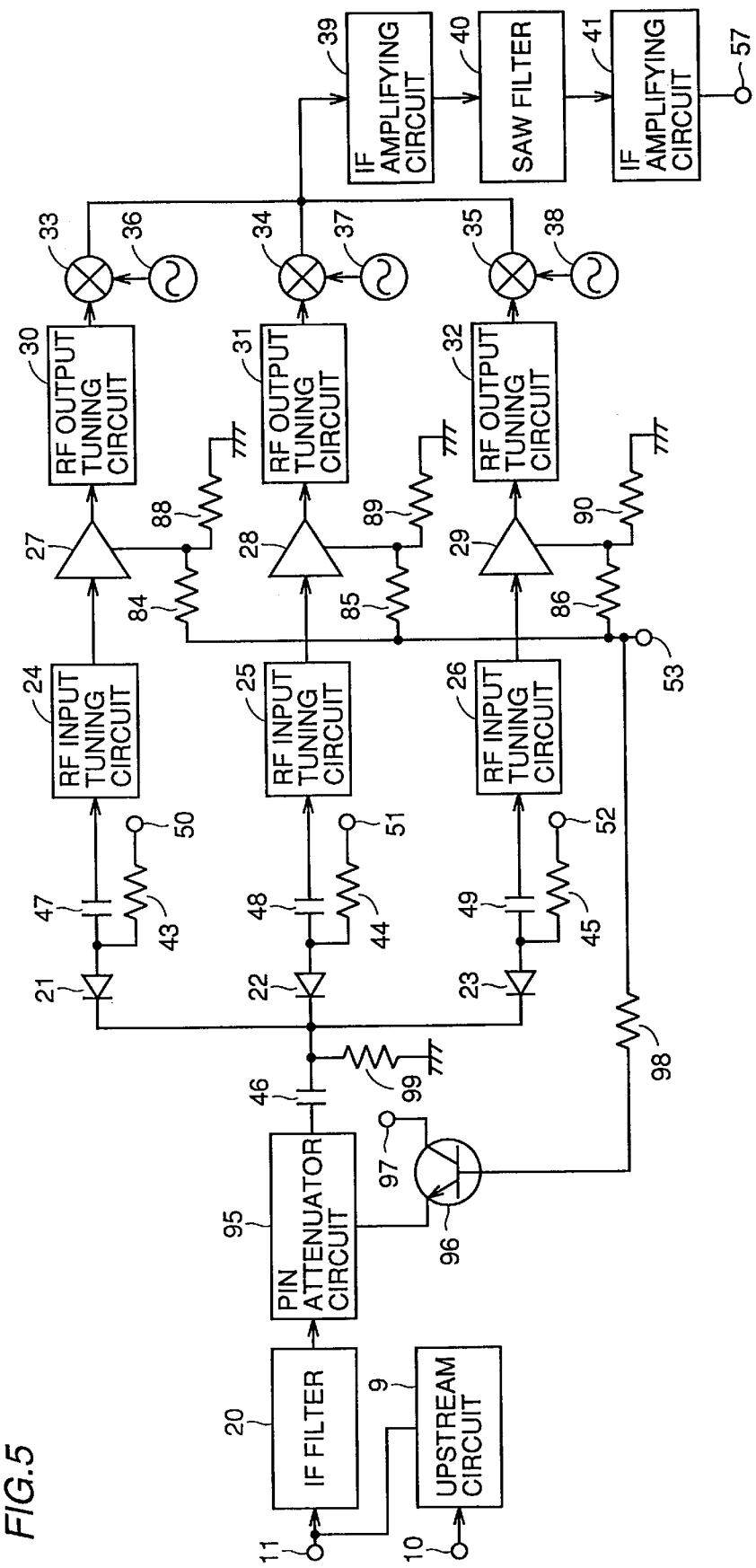
FIG. 5 is a circuit diagram showing a fourth embodiment of the present invention.

FIG. 5 is a circuit diagram showing a fourth embodiment of the present invention. In FIG. 5, portions corresponding to those of the third embodiment shown in FIG. 4 are denoted by the same reference characters and description thereof is not repeated. The present embodiment differs from the third embodiment in that PIN diodes 21, 22 and 23 are not subjected to AGC but a PIN attenuator circuit 95 is provided in a preceding stage of PIN diodes 21, 22 and 23 which attenuator circuit 95 is subjected to AGC.

More specifically, In the fourth embodiment, the common circuit shown in FIG. 18 is not significantly modified but PIN attenuator circuit 95 is simply provided in an input circuit of the tuner. Bias is supplied to PIN attenuator circuit 95 through an NPN transistor 96 from a power supply 97 which is common to all the bands. AGC voltage is supplied from AGC terminal 53 through AGC resistor 98 to NPN transistor 96, so as to control amount of attenuation of PIN attenuator circuit 95. AGC bias for RF amplifying circuits 27, 28 and 29 is set in the similar manner as the third embodiment described above. In this manner, delayed AGC operation is possible in the fourth embodiment similar to the third embodiment described above, and therefore improvement in characteristic related to distortion is possible.

Figure 6:
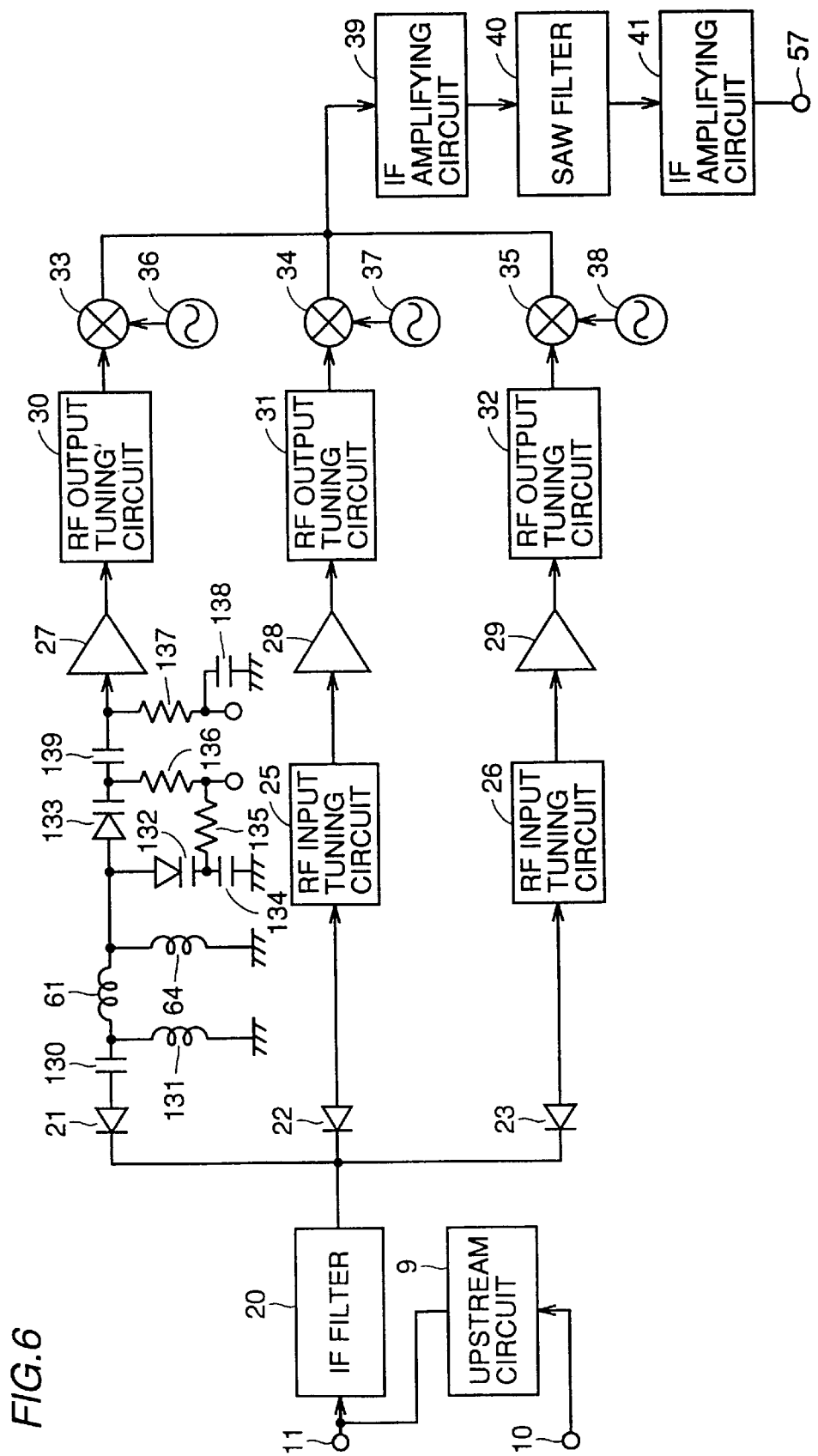
FIG. 6 is a circuit diagram showing a fifth embodiment of the present invention.

FIG. 6 is a circuit diagram showing a fifth embodiment in which portions corresponding to FIGS. 4 and 5 are denoted by the same reference characters and description thereof is not repeated. The fifth embodiment relates to an improvement of the RF input tuning circuit of the above described embodiments, especially to improvement of characteristic in UHF band.

Referring to FIG. 6, a capacitor 130 and a coil 131 constitute a high pass filter of which cut off frequency is 400 MHz. There are an impedance matching coil 61, a tuning coil 64, variable capacitance diodes 132 and 133, a capacitor 134 for suppressing capacitance variation ratio, bias resistors 135 and 136, a DC cut capacitor 139, a bias resistor 137 and a bypass capacitor 138 further provided.

Capacitor 130 and coil 131 constitute a high pass filter, while tuning coil 64, variable capacitance diode 132 and capacitor 134 for suppressing capacitance variation ratio constitute a tuning circuit. Impedance matching coil 64 and matching variable capacitance diode 133 attains matching with the tuning circuit. The bias voltage to variable capacitance diodes 132 and 133 is supplied through bias resistors 135 and 136 for supplying the tuning current, while bias for RF amplifying circuit 27 is supplied by resistor 137 and bypass capacitor 138.

In the circuit shown in FIG. 3, by the input capacitances of RF choke coil 68 provided on the input side of RF amplifying circuit 27 and of RF amplifying circuit 27, a resonator circuit of which resonance frequency is about 400 MHz is formed, and therefore it is susceptible to the influence of disturbing signals when desired signals are received. However, since bias to the RF amplifying circuit 27 is supplied by resistors in the fifth embodiment, there is not a resonator circuit formed, and therefore influence of disturbing signals can considerably be reduced.

Figure 7:
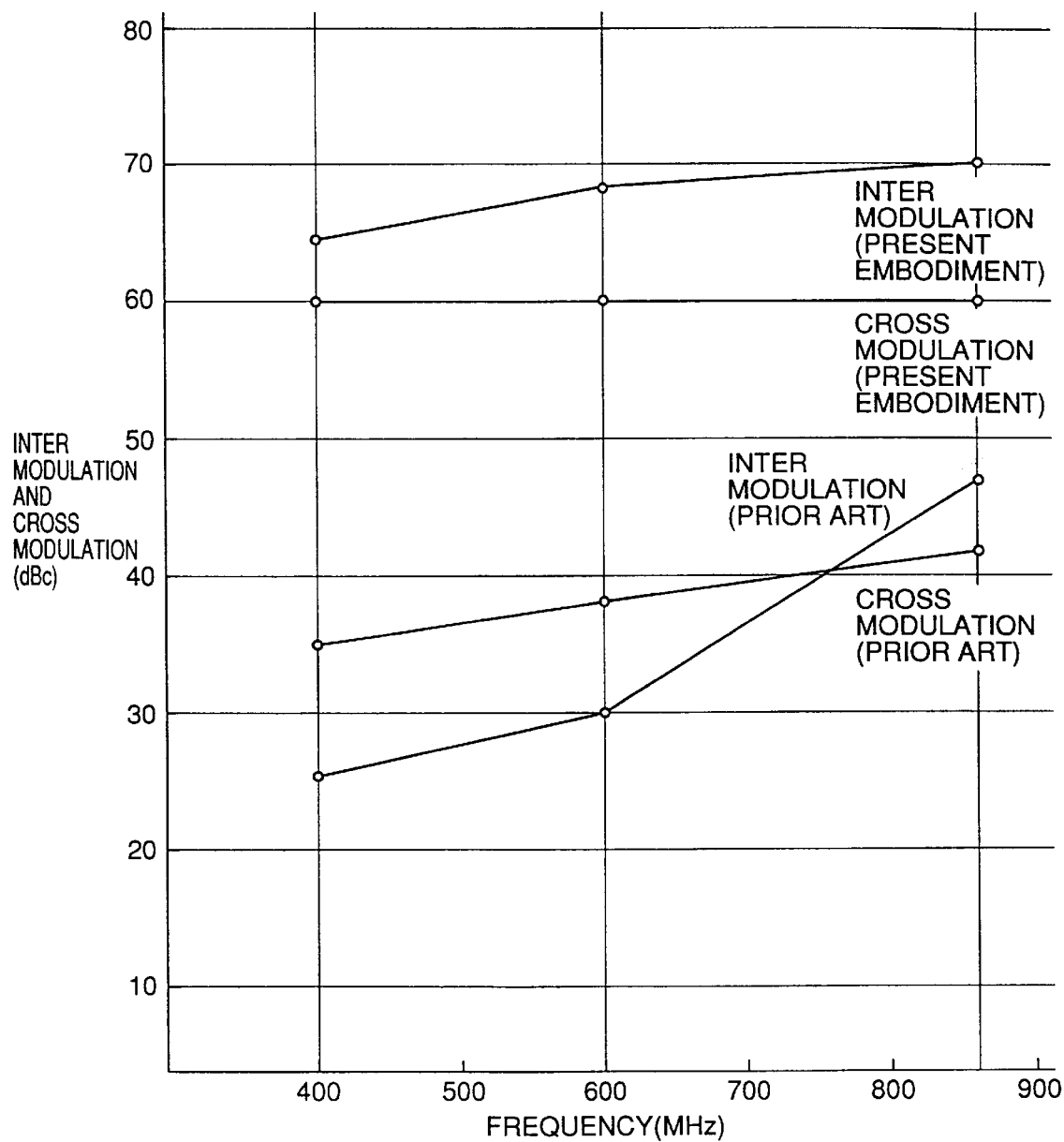
FIG. 7 is a graph showing characteristics of the embodiments of the present invention and conventional example in comparison.

FIG. 7 is a graph showing distortion experienced in the RF input tuning circuit in accordance with the fifth embodiment compared with the prior art. It can be seen that inter modulation such as CSO (Composite Second Order Beat) and CTB (Composite Triple Beat) is improved by more than 15 dB, and cross modulation is improved by more than 10 dB. At the same time, selectivity and characteristics are improved with respect to image ratio and local oscillation signal leak, and as the selectivity is improved, deterioration of power gain and noise figure can be suppressed.

Figure 8:
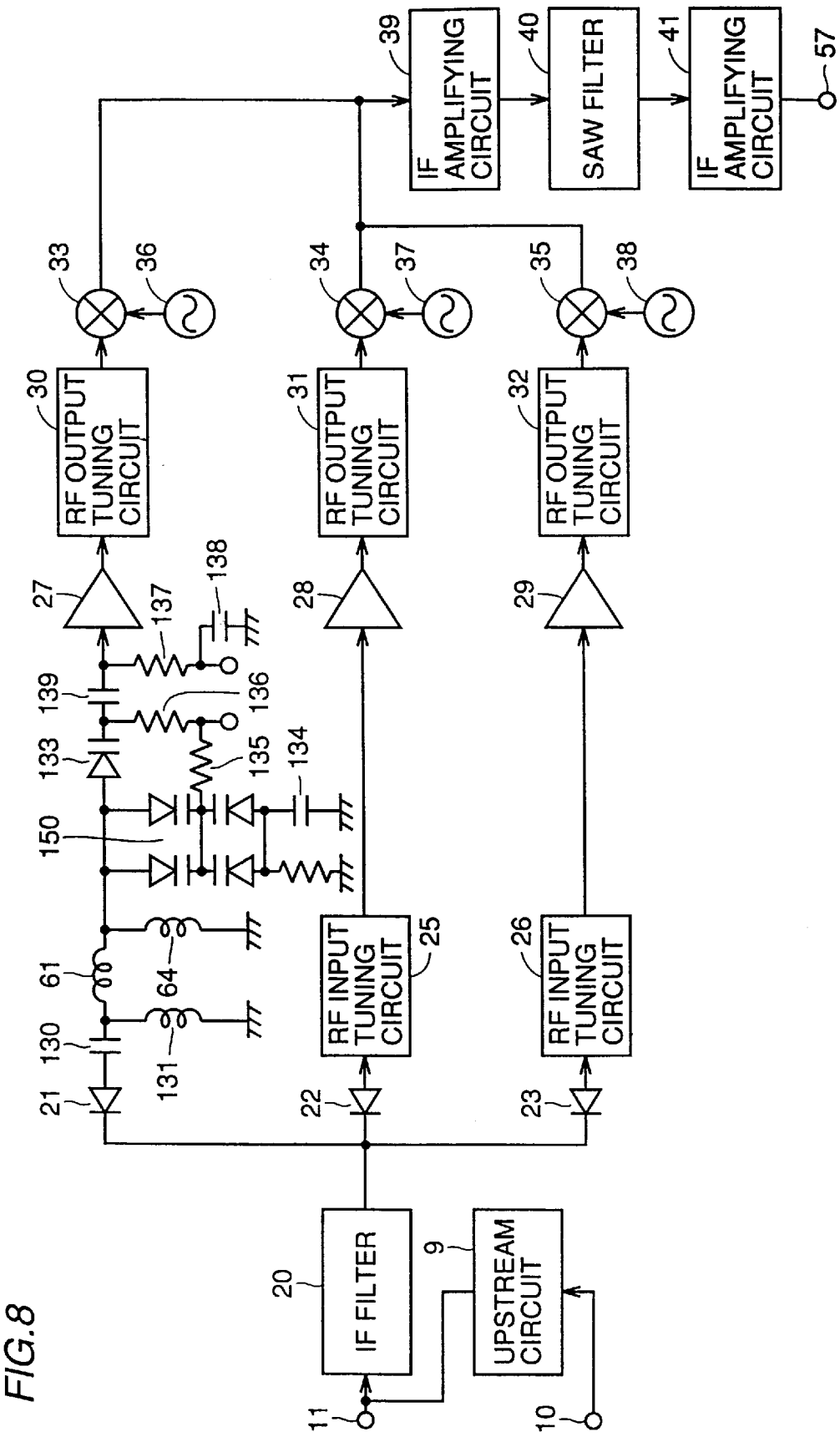
FIG. 8 is a circuit diagram in accordance with a sixth embodiment of the present invention.

FIG. 8 is a circuit diagram showing a sixth embodiment in which portions corresponding to the embodiment of FIG. 6 are denoted by the same reference characters and description thereof is not repeated. Referring to FIG. 8, the present embodiment differs from that of FIG. 6 in that variable capacitance diode 132 for tuning shown in FIG. 6 is replaced by a variable capacitance diode circuit 150 in which parallel connections of similar variable capacitance diodes are connected in series in reverse direction.

The variable capacitance diode, which is a tuning capacitor for the RF input tuning circuit, will be described. The tuning capacitor is implemented by a single variable capacitance diode element 1 as shown in FIG. 6 and exhibits its function. However, when multiwave CATV signals have high input levels of 75 dBμ or higher, and especially when the bias applied to the variable capacitance diode is shallow, the capacitor would be in wide amplitude mode, exhibiting detecting function, as is well known.

Accordingly, in the present embodiment, generation of distortion is suppressed by utilizing the nature that when variable capacitance diodes are connected in series, the signal level applied to the opposing ends of the series connection is reduced to ½. However, when diodes are simply connected in series, internal resistance (series resistance) of the variable capacitance diodes are connected in series, decreasing effective Q as a resonator circuit, deteriorating selectivity.

In order to solve this problem, diodes of the same characteristics are connected in parallel and the parallel connected diodes are connected in series. By the parallel connection of diodes having the same characteristics, the internal resistance can be reduced to ½, while capacitance variation ratio is the same as before the modification. Further, minimum value of tuning capacitance can also be kept the same as before. The variable capacitance diodes are to have the same characteristics in order to prevent tracking error between the local oscillation circuit and the resonator circuit (tuning circuit) of the RF amplifying circuit.

Figure 9:
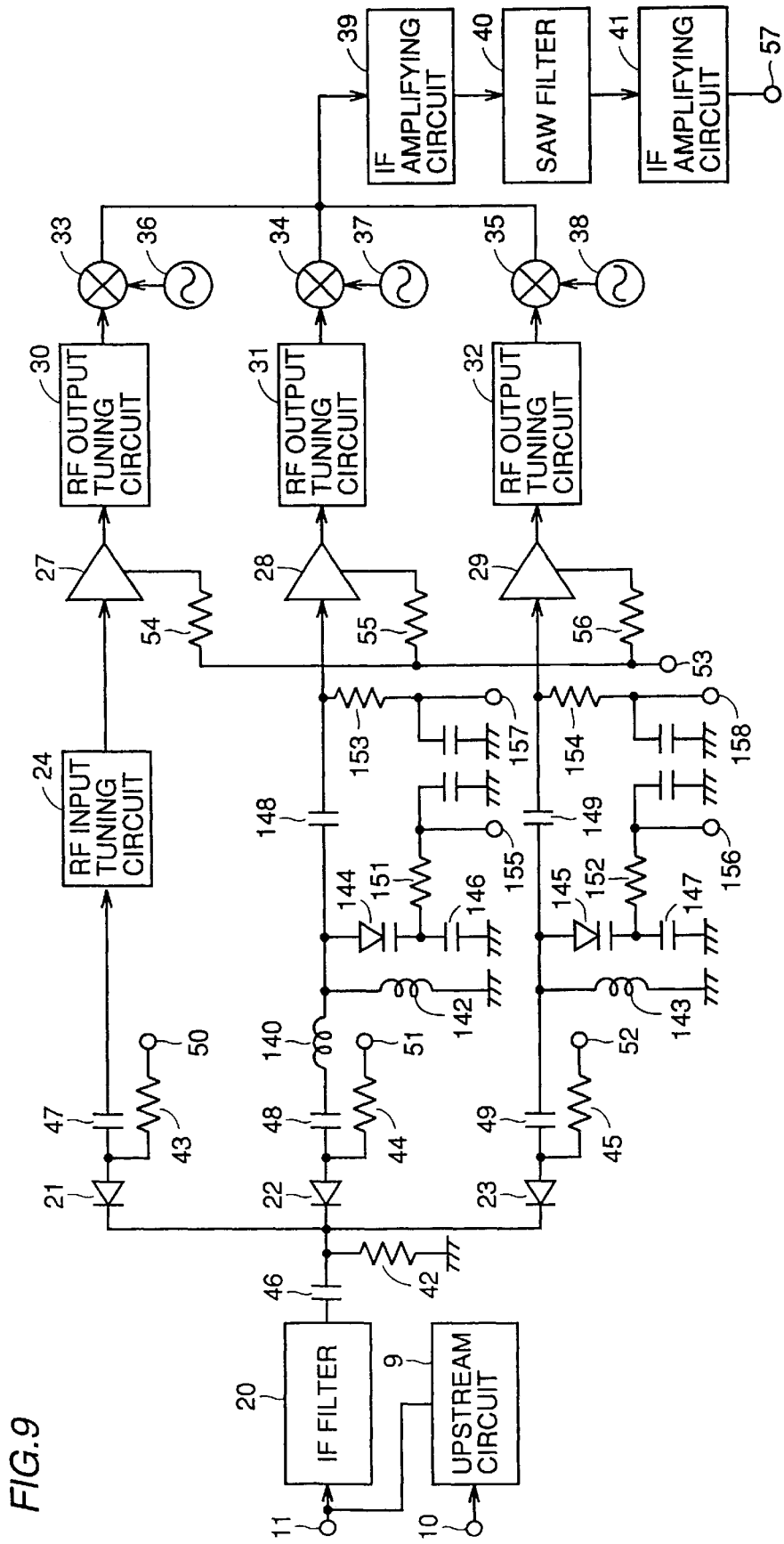
FIG. 9 is a circuit diagram showing a seventh embodiment of the present invention.

Prior to the description of the present embodiment, the circuitry shown in FIG. 2 will be described again in order to clarify difference between the present embodiment and that of FIG. 2. In the embodiment shown in FIG. 2, RF input tuning circuit 25 and 26 for the VHF•HIGH band and VHF•LOW band are as shown in FIG. 9. In FIG. 9 showing the seventh embodiment, portions corresponding to those of FIG. 2 are denoted by the same reference characters and description thereof is not repeated.

Referring to FIG. 9, tuning coils 142 and 143, variable capacitance diodes 144 and 145 and capacitors 146 and 147 constitute tuning circuits for the VHF•HIGH band and VHF•LOW band, respectively. Impedance matching coils 140 and 141 and coupling capacitors 148 and 149 attain matching between RF input tuning circuits 25 and 26 with the input signal switching circuit of the preceding stage and with the RF amplifying circuits 28 and 29 of the succeeding stage.

The tuning voltage is applied from tuning voltage input terminals 155 and 156 through bias resistors 151 and 152 to variable capacitance diodes 144 and 145. By the tuning voltage applied to variable capacitance diodes 144 and 145, the tuning point of the tuning circuit is adjusted.

Bias to the RF amplifying circuits 28 and 29 is supplied from bias power supply terminals 157 and 158 of the VHF•HIGH band and VHF•LOW band through bias resistors 153 and 154. To the first gate of a dual gate MOSFET which is the component of RF amplifying circuits 28 and 29, an input signal RF input tuning circuits is supplied, and to the second gate of the MOSFET, reverse AGC voltage is applied from AGC terminal 53 through resistors 55 and 56.

Therefore, DC voltage is applied to AGC terminal 53 such that full gain operation is ensured when the input signal level of RF amplifying circuits 28 and 29 is not higher than 60 dBμ, and that the output level of the tuner is always kept constant when the input signal level exceeds 60 dBμ. Since the DC voltage is connected to the second gate of the dual gate MOSFET, it has a function that power gain of the RF amplifying circuit is reduced when the DC voltage is applied in the reverse direction.

The CATV signals include a number of signals of about 100 channels and the signals are input to an input terminal of the tuner at the same time at the same level. The signals are passed to the input tuning circuit from which desired signals are output, which signals are applied to the first gate of the dual gate MOSFET serving as the RF amplifying circuit. However, there has been a problem that when the input signal level exceeds 60 dBμ, possibility of inter modulation such as CSO and CTB and cross modulation becomes higher. Further, when multiwave CATV input signals are applied as signals having input signal levels of 75 dBμ or higher to RF input tuning circuits 25 and 26, possibility of inter modulation and cross modulation increases in variable capacitance diodes 144 and 145.

Figure 10:
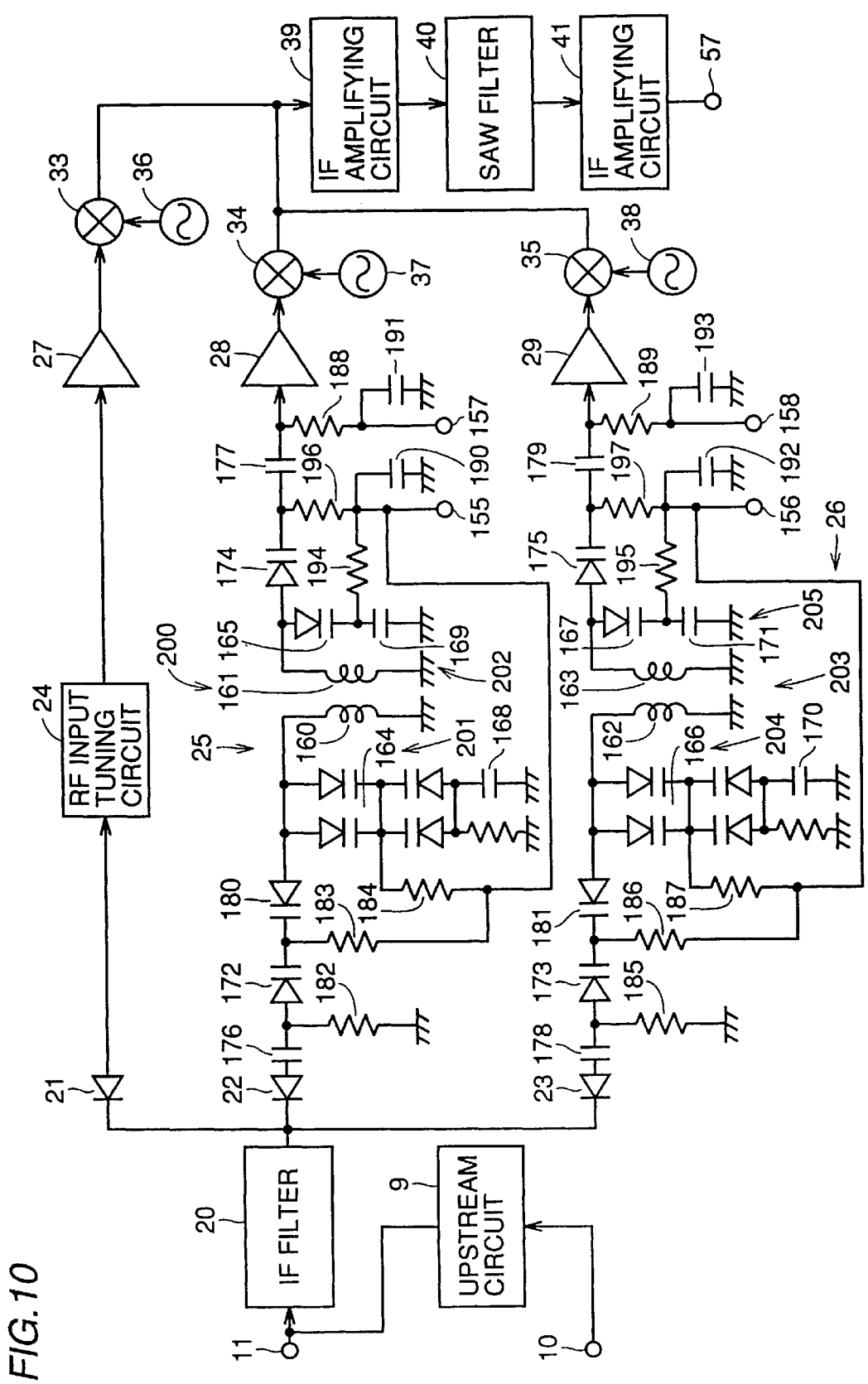
FIG. 10 is a circuit diagram showing an eighth embodiment of the present invention.

FIG. 10 is a circuit diagram showing an eighth embodiment of the present invention in which portions corresponding to the fifth and sixth embodiment shown in FIGS. 6 and 8 are denoted by the same reference characters and description thereof is not repeated. The eighth embodiment shown in FIG. 10 is directed to improvement of characteristics related to distortion of RF input tuning circuit, and especially improvement of characteristics related to inter modulation of the RF input tuning circuits for the VHF•HIGH band and VHF•LOW band. According to the present embodiment, distortion is suppressed even when multichannel signals as CATV signals are input at the high signal input level of 60 dBμ or higher.

The RF amplifying circuit provided in the succeeding stage of the RF input tuning circuit is formed by a dual gate MOSFET. However, the dual gate MOSFET is susceptible to distortion when multiwave signals at the input level of not lower than 60 dBμ are input. Therefore, the present invention is directed to improvement of the characteristics of the RF input tuning circuit to prevent input of such signals. Further, the characteristic related to distortion of the tuning circuit is improved by lowering the signal level applied to each element of the variable capacitance diodes of the input tuning circuit.

Referring to FIG. 10, RF input tuning circuit 25 for the VHF•HIGH band includes a double tuning circuit 200, variable capacitance diodes 172 and 180 for attaining impedance matching with the circuit of the preceding stage, and variable capacitance diode 174 for attaining impedance matching with the circuit of the succeeding stage. Double tuning circuit 200 consists of a first resonator circuit 201 including a tuning coil 160 and a variable capacitance diode, and a second resonator circuit 202 including a tuning coil 161 coupled to tuning coil 160 and a variable capacitance diode 165. Variable capacitance diode 164 is formed by connecting in series circuits provided by parallel connection of variable capacitance diodes having substantially the same characteristics.

To variable capacitance diodes 172, 180 and 174 for matching, a bias voltage is applied through resistors 183 and 196, while a bias voltage for tuning is applied to variable capacitance diodes 164 and 165 through resistors 184 and 194. The bias voltage is applied to tuning voltage input terminal 155. A bias voltage is applied from a bias voltage terminal 157 through a resistor 188 to RF amplifying circuit 28 of the succeeding stage. A bypass capacitor 190 is connected to tuning voltage input terminal 155, and a bypass capacitor 191 is connected to bias voltage terminal 157.

RF input tuning circuit 26 for the VHF•LOW band is structured similar to the above described RF input tuning circuit 25. A first resonator circuit 204 including tuning coil 162 and variable capacitance diode 166 and a second resonator circuit 205 including tuning coil 163 and variable capacitance diode 167 constitute a double tuning circuit 203. In addition, the RF input tuning circuit includes variable capacitance diodes 173, 181 and 175 for matching, bias resistors 185 to 189 and bypass capacitors 192 and 193.

The received signals of the VHF•HIGH band and VHF•LOW band selected by selecting circuits 22 and 23 consisting of PIN diodes are matched by variable capacitance diodes 172, 183 and 173, 181 for matching, thereafter passed to tuning circuits including variable capacitance diode circuits 164 and 166, coils 160 and 162 and capacitors 168 and 170 for suppressing capacitance variation ratio, and tuned to signals having frequencies determined by the tuning voltage input from tuning voltage input terminals 155 and 156, respectively.

The signals tuned by the tuning circuits are transmitted to tuning coils 161 and 163 coupled to coils 160 and 162, respectively, and again tuned by the tuning voltage input from tuning voltage input terminals 155 and 156 by the tuning circuits including coils 161 and 163, variable capacitance diodes 165 and 167, capacitors 169 and 171 for suppressing capacitance variation ratio, respectively.

The tuned signals are supplied to input terminals of RF amplifying circuits 28 and 29 of the succeeding stage through variable capacitance diodes 174 and 175 for matching with the circuits of the succeeding stage and through DC cut off capacitors 177 and 179. To the input terminals of RF amplifying circuits 28 and 29, a bias voltage is applied through resistors 188 and 189, so that AGC operation is performed for the strong input signals.

Variable capacitance diode circuits 164 and 166 which are tuning capacitors for the RF input tuning circuit will be described. Conventionally, a tuning capacitor consists of one variable capacitance diode element. However, when multiwave CATV signals are at the high level of not lower than 75 dBμ, especially when the bias applied to the variable capacitance diode is shallow, it enters a wide amplitude mode, exhibiting detecting function. In order to solve this problem, in the present embodiment, two variable capacitance diodes are connected in series so that the signal level applied to the opposing ends of the connection is reduced to ½, thereby suppressing distortion.

However, simple series connection of diodes means that internal resistances (series resistance) of the variable capacitance diodes are connected in series, which deteriorates effective Q (sharpness) of the resonator circuit, and deteriorates selectivity. In order to solve this problem, diodes having the same characteristics are connected in parallel, and the parallel connections are connected in series. By connecting diodes of the same characteristics in parallel, the internal resistance can be reduced to ½, while the capacitance variation ratio is the same as before modification.

Further, the minimum value of tuning capacitance can be made the same as before modification by this structure. Further, since variable capacitance diodes are adapted to have the same characteristics, it becomes possible to prevent tracking error between the local oscillation circuit and the resonator circuit (tuning circuit) of the RF amplifying circuit. Since distortion is likely also in variable capacitance diodes 172 and 173 for attaining matching with the tuning circuit, variable capacitance diodes are connected in parallel and in series as in the variable capacitance diodes 164 and 166 for tuning described above, so as to suppress distortion.

Figure 11:
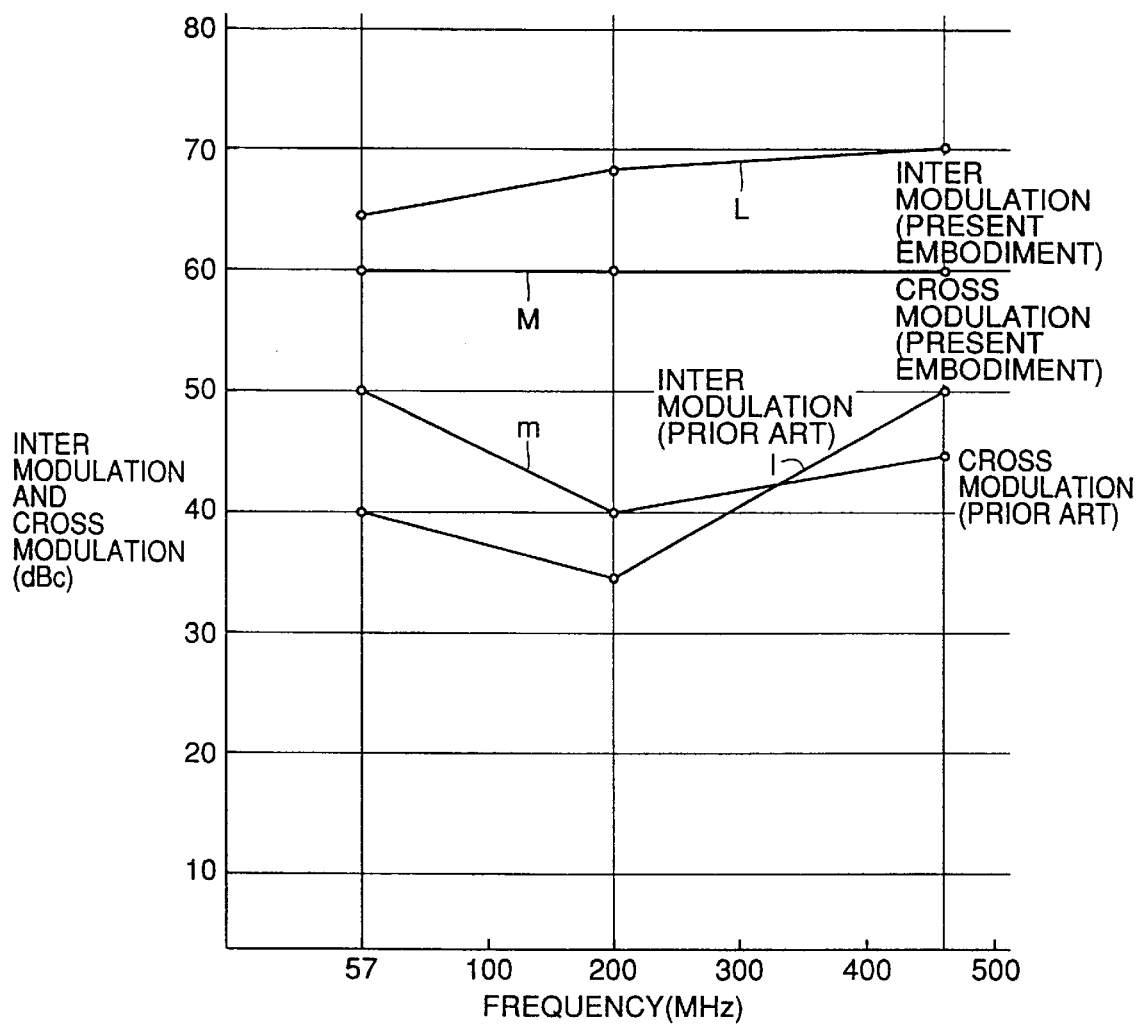
FIG. 11 is a graph showing, in comparison, inter modulation and cross modulation in accordance with the embodiment of the present invention and a conventional example.

FIG. 11 is a graph showing improvement in inter modulation and cross modulation as compared with the prior art. As is apparent from FIG. 11, inter modulation including CSO and STB of the prior art is as represented by the line l, while the inter modulation in accordance with the present invention is as represented by the line L, which means that there is an improvement of more than 15 dB. The cross modulation of the prior art is as shown by the line m while that of the present embodiment is as represented by the line M, which means that there is improvement of more than 10 dB. Further, characteristics related to image ratio and local oscillation signal leak are improved, resulting in improved selectivity. Since the selectivity is improved, deterioration of power gain and noise figure can be suppressed.

Figure 12:
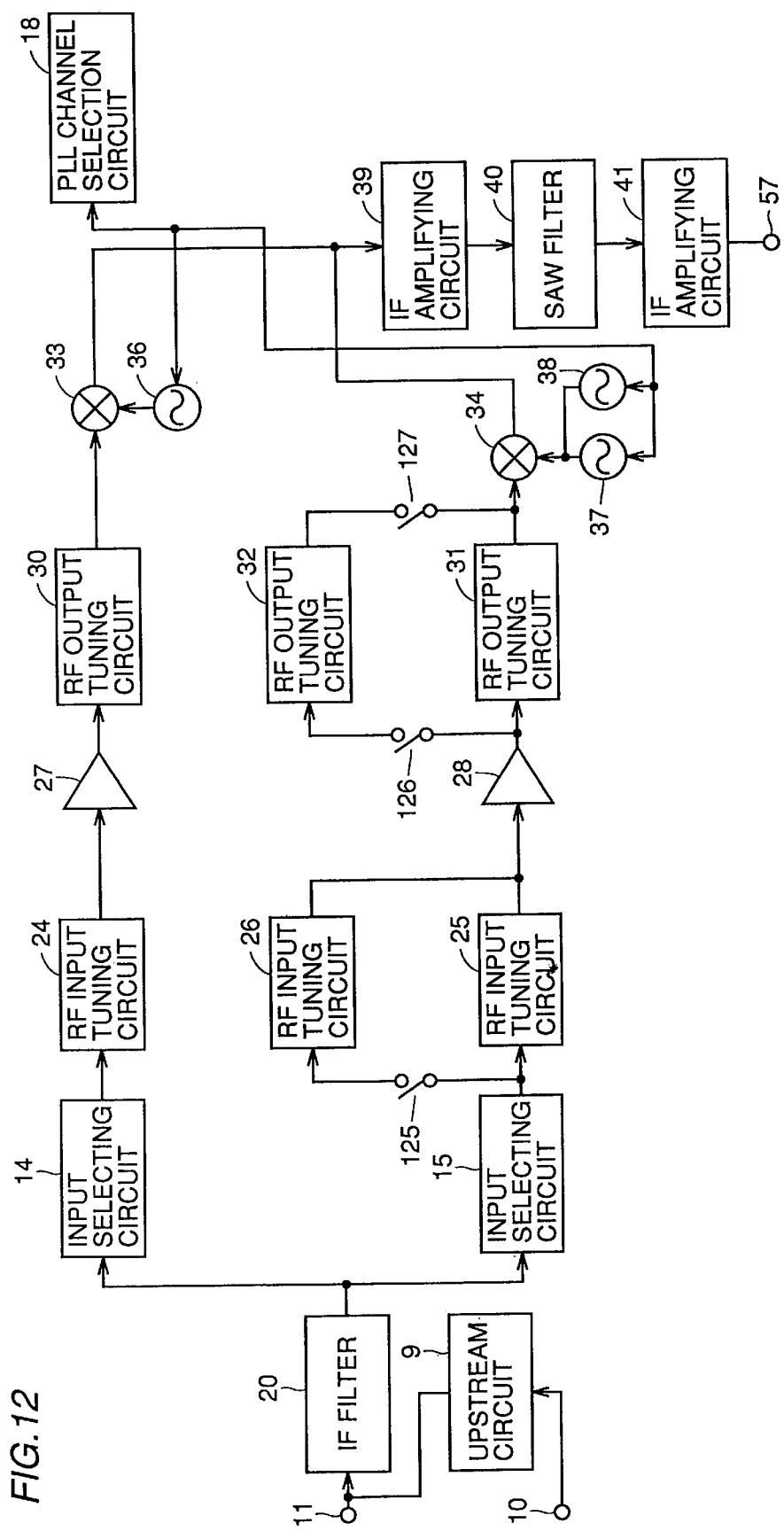
FIG. 12 is a block diagram showing a ninth embodiment of the present invention.

FIG. 12 is a block diagram showing a ninth embodiment of the present invention. According to the present invention, the tuner for the cable modem is reduced in circuit scale than the prior art example shown in FIG. 18, by utilizing a circuit structure including two systems. The upstream signal which has been subjected to QPSK modulation is input from data terminal 10 to upstream circuit 9, and transmitted from upstream circuit 9 through input terminal 11 to the CATV station. The downstream signal input to input terminal 1 is passed through high pass filter 20 and input to input selecting circuits 14 and 15. High pass filter 20 has attenuation range of 5 to 46 MHz and pass band of not lower than 54 MHz, and it intercept upstream signal output from upstream circuit 9.

Input selecting circuits 14 and 15 are formed of switching diodes, as will be described later, and switch signals which have passed high pass filter 20 to circuitry for UHF band and VHF band, respectively, as will be described later. Input selecting circuits 14 and 15 may switch output by band width division using a filter.

When a channel of the UHF band is received, input selecting circuit 14, RF input tuning circuit 24, RF amplifying circuit 27, RF output tuning circuit 30, mixer circuit 33 and local oscillation circuit 36 for the UHF band are set to the operative state, while operations of input selecting circuit 15, RF input tuning circuits 25 and 26, RF amplifying circuit 28, RF output tuning circuits 31 and 32, mixer circuit 34 and local oscillation circuits 37 and 38 for the VHF band is stopped.

When a channel of the VHF•HIGH band is received, input selecting circuit 15, RF input tuning circuit 25, RF amplifying circuit 28, RF output tuning circuit 31, mixer circuit 34 and local oscillation circuit 37 for the VHF band are set to the operative state, and operations of input selecting circuit 14, RF input tuning circuit 24, RF amplifying circuit 27, RF output tuning circuit 30, mixer circuit 35 and local oscillation circuit 36 for the UHF band are stopped. At this time, switching diodes 125 to 127 for switching are OFF, and hence RF input tuning circuit 26 and RF output tuning circuit 32 do not operate.

When a channel of the VHF•LOW band is received, switching diodes 125 to 127 are turned ON, and input selecting circuit 15, RF input tuning circuits 25 and 26, RF amplifying circuit 28, RF output tuning circuits 31 and 32, mixer circuit 34 and local oscillation circuit 38 for the VHF band are set to the operative state. Operations of input selecting circuit 14, RF input tuning circuit 24, RF amplifying circuit 27, RF output tuning circuit 30, mixer circuit 33 and local oscillation circuit 36 for the UHF band are stopped.

Common circuitry including upstream circuit 9, high pass filter 20, IF amplifying circuits 39 and 41, SAW filter 40 and PLL channel selection circuit 18 operate constantly regardless of switching between bands. PLL channel selection circuit 18 operates upon reception of channel selection data from the CPU, and controls oscillation frequency of local oscillation circuits 36, 37 and 38. The CPU controls input selecting circuits 14 and 15 and switching diodes 125 to 127 in accordance with the band, and switches the circuitry.

The state of operation for respective bands will be described. The CATV signals pass through high pass filter 20 and enter input selecting circuits 14 and 15, where the signals are switched in accordance with the band, as described above. The output signals from input selecting circuit 14 or 15 are tuned by RF input tuning circuit 24 or input tuning circuits 25 and 26. The signals are amplified by RF amplifying circuit 27 or 28, and the received signals are output from RF output tuning circuit 30 or output tuning circuits 31 and 32.

Thereafter, the received signals have their frequency converted to IF signal by mixer circuit 33 or 34 and by local oscillation circuit 36 or local oscillation circuit 37 and 38, and thereafter amplified by IF amplifying circuit 39. Thereafter, the resulting signals are passed to SAW filter 40 and amplified by IF amplifying circuit 41, and output from output terminal 57.

Figure 13:
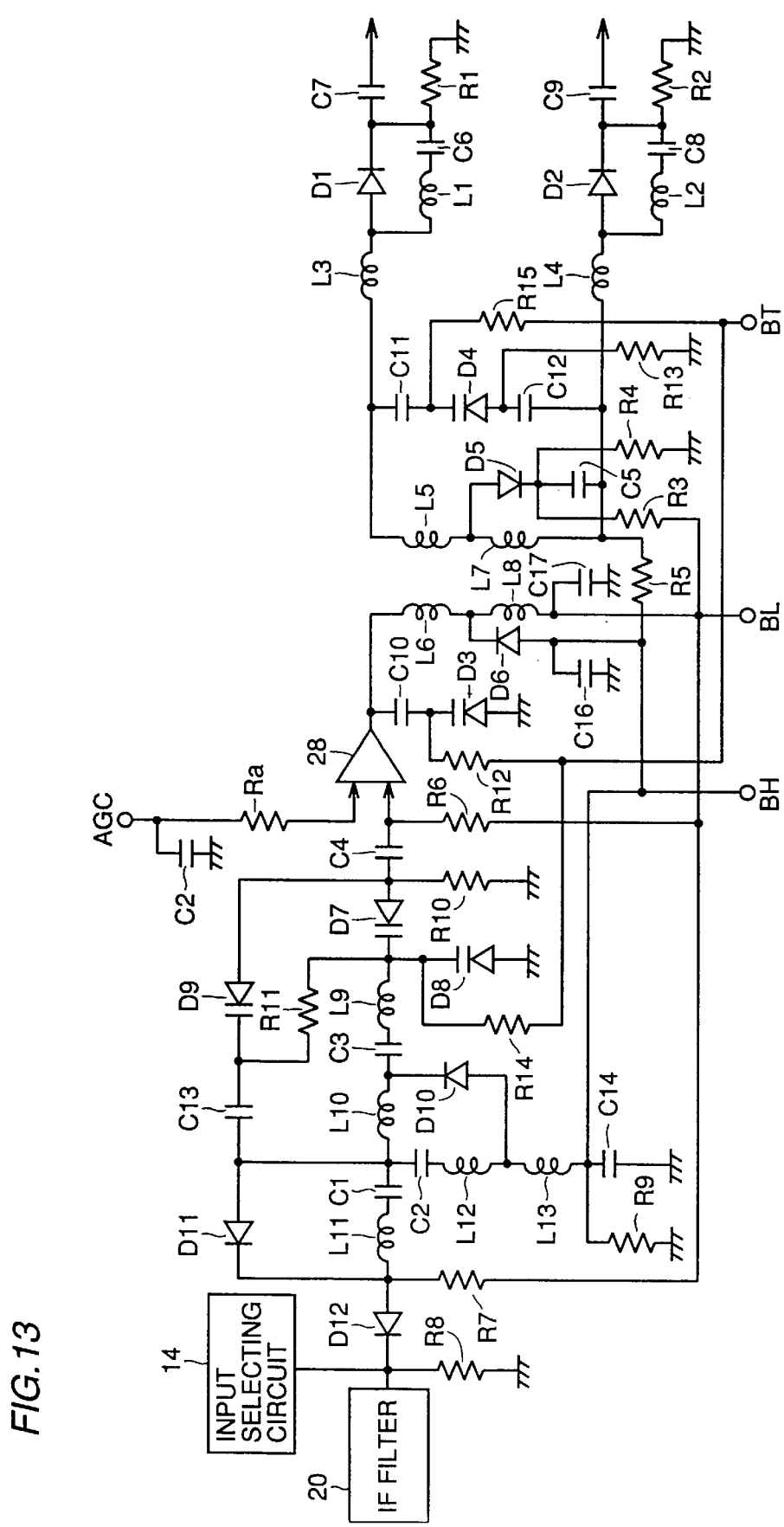
FIG. 13 is a circuit diagram showing a tenth embodiment of the present invention.

The feature of the present embodiment resides in the system for the VHF band. As a tenth embodiment, a specific circuitry for the VHF band system is shown in FIG. 13. When a channel of the VHF band is received, a voltage is applied to a power supply terminal PL under the control by the CPU, whereby a bias is supplied to switching diode D12 through bias resistors R7 and R8 so that switching diode is turned ON, and the signal from high pass filter 20 is passed. Meanwhile, when a channel of the UHF band is received, voltage is not applied to power supply terminal BL. Therefore, switching diode D12 is OFF, shutting off the signal. Switching diode D1 corresponds to input selecting circuit 15 of FIG. 12.

When a channel of the VHF•HIGH band is received, a voltage is applied further to power supply terminal BH which is passed to matching coil L13 to switching diode D10 to turn ON the switching diode D10, and further passed to diode D10 and coil L10 to switching diode D11 to turn ON the diode D11. Diode D11 has its cathode connected to the anode of diode D12.

Further, as the voltage is applied to power supply terminal BH, switching diode D6 is turned ON, and switching diode D5 is turned on through bias resistor R5 and coil L7. Further, switching diode D1 is turned ON, through matching coil L5 on the anode side of diode 5. Further, switching diode D2 is connected to a node between resistor R5 and coil L7 with a matching coil L4 interposed, whereby the diode D2 is turned ON when the voltage is applied to power supply terminal PH.

Accordingly, tuning coils L9 and L13 and variable capacitance diode D8 constitute a tuning circuit. The tuning point of the tuning circuit is adjusted by the tuning voltage applied to variable capacitance diode D8 from terminal BT through resistor R14. The tuning voltage is supplied from a tuning voltage applying circuit (not shown). Reference characters L11 and L12 are coils for matching. The selected signal is amplified by RF amplifying circuit 28, and provided to RF output tuning circuits 31 and 32 (see FIG. 12).

In RF output tuning circuits 31 and 32, switching diodes D6, D7, D1 and D2 are turned ON, variable capacitance diode D3 and tuning coil L6 constitute a primary side tuning circuit, and variable capacitance diode D4 and tuning coil L5 coupled to coil L6 constitute a secondary side tuning circuit. Reference characters C10 to C12 represent capacitance for suppressing capacitance variation ratio.

When a channel of the VHF•LOW band is received, voltage is not applied to power supply terminal BH, and switching diodes D1, D2, D5, D6, D10 are turned OFF. Therefore, in RF input tuning circuits 25 and 26, tuning circuit is formed by D8, L9, L10, L12 and L13.

In RF output tuning circuits 31 and 32, D3, L6 and L8 constitute a primary side tuning circuit, and D4, L5 and L7 constitute a secondary side tuning circuit. Coils L5 and L7 are coupled to coils L6 and L8. Coils L1, L3 and L2 and L4 for matching are coupled to mixer circuit 34. Variable capacitance diode D7 is inserted for attaining matching with RF input tuning circuit 25 and 26. By variable capacitance diode D9 and an image trap capacitor C13, a variable image trap is formed. This removes image frequency, and distortion of signals in mixer circuit 34 can be prevented.

AGC voltage is applied to an AGC terminal by an AGC control circuit (not shown) and supplied to RF amplifying circuit 28 through a resistor Ra. A dual gate MOSFET is used for RF amplifying circuit 28, and to the first gate of the MOSFET, a signal from RF input tuning circuits 25 and 26 is supplied and to the second gate, the AGC voltage is supplied. Reference characters C1 to C9 represent DC cut off capacitors. C14 to C17 represent bypass capacitors.

As described above, according to the present embodiment, as compared with the tuner for the cable modem shown in FIG. 1 which is divided into three systems, the tuner is divided into two systems by sharing RF amplifying circuit 108 and mixer circuit 114 by VHF•HIGH band and VHF•LOW band, in the system for the VHF band. Therefore, as compared with the tuner for the cable modem shown in FIG. 1, circuit scale can be reduced and the cost can be reduced by about 20%. Since the number of RF amplifying circuit can be reduced to two, power consumption can also be reduced.

Figure 14:
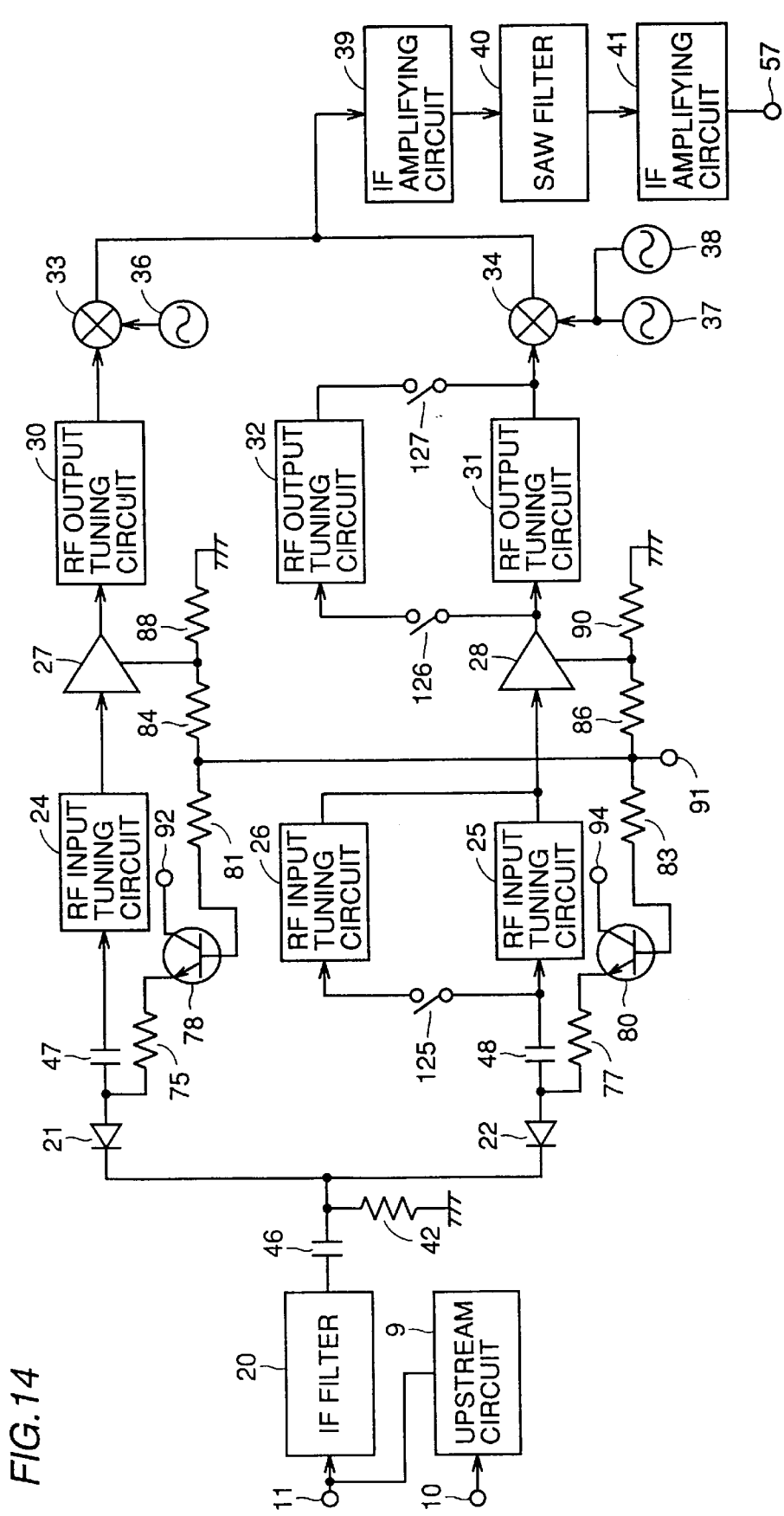
FIG. 14 is a circuit diagram showing an eleventh embodiment of the present invention.

FIG. 14 is a circuit diagram showing an eleventh embodiment of the present invention in which portions corresponding to those of FIG. 12 are denoted by the same reference characters and description thereof is not repeated. PLL channel selection circuit 18 (see FIG. 12) is not shown in FIG. 14 for simplicity. In the present embodiment, input selecting circuits 14 and 15 of FIG. 12 are formed by PIN diodes 21 and 22, which PIN diodes 21 and 22 are subjected to AGC voltage control together with RF amplifying circuits 27 and 28 of the succeeding stage, so as to improve characteristics related to nonlinear distortion of RF amplifying circuits 27 and 28.

Referring to FIG. 14, the system for the UHF band includes PIN diode 21, DC cut off capacitor 47, RF input tuning circuit 24, RF amplifying circuit 27, RF output tuning circuit 30, mixer circuit 33, local oscillation circuit 36, bias resistors 75 and 88, AGC bias resistors 81 and 84, and NPN transistor 78.

The system for the VHF band includes PIN diode 22, DC cut off capacitor 48, RF input tuning circuit 25 and 26, RF amplifying circuit 28, RF output tuning circuits 31 and 32, mixer circuit 34, local oscillation circuit 37 and 38, bias resistors 77 and 90, AGC bias resistors 83 and 86 and NPN transistor 80. RF amplifying circuits 27 and 28 are formed of dual gate MOSFET. To the first gate of the MOSFET, a signal output from RF input tuning circuits 24, or input tuning circuits 25 and 26 is input, and to the second gate, a signal input through AGC terminal 91 is input through resistor 84 or 86.

The CATV signals input to terminal 11 are passed through high pass filter 20 which removes an upstream signal of 5 to 46 MHz and thereafter transmitted through DC cut off capacitor 46 to PIN diodes 21 and 22. Generally, a PIN diode has such a characteristic that high frequency resistance is changed by controlling current from the anode to the cathode, and it is used in an attenuator circuit and the like.

Bias resistors 42, 75 and 77 supply bias to PIN diodes 21 and 22, of which current is controlled by NPN transistors 78 and 80. Transistors 78 and 80 have collectors connected power supply terminals 92 and 94, respectively, and provide bias to PIN diodes 21 and 22 from respective emitters. Transistors 78 and 80 have their bases connected to AGC terminal 91 through AGC resistors 81 and 83, respectively, and bias is controlled by the AGC voltage supplied to AGC terminal 91 from AGC control circuit (not shown).

Therefore, selection between the UHF and VHF bands is dependent on the voltage applied to power supply terminals 92 and 94. For example, when a voltages is applied to power supply terminal 92 and not to power supply terminal 94, the CATV signals are input to the circuitry for the UHF band, while CATV signals are not input to the circuitry for the VHF band. When the voltage is applied not to power supply terminal 92 but to power supply terminal 94, signals are not input to the circuitry for the UHF band and signals are input to the circuitry for the VHF band. At this time, in accordance with the difference between VHF•HIGH band and VHF•LOW band, switching diodes 125 to 127 are turned ON/OFF by the CPU.

The CATV signals are selected by PIN diodes 21 and 22 as described above, and passed to DC cut off capacitor 47 or 48, and supplied to RF input tuning circuit 24 or input tuning circuits 25 and 26. The signals tuned to the desired signal by RF input tuning circuit 24 or tuning circuits 25 and 26 are amplified by RF amplifying circuit 27 or 28, and again tuned by RF output tuning circuit 30 or tuning circuits 31 and 32. Thereafter, the signals are converted to IF signals by mixer circuit 33 or 34 and local oscillation circuit 36 or local oscillation circuits 37 and 38.

When a channel of the VHF•HIGH band is received, local oscillation circuit 37 is set to the operative state, and local oscillation circuit 38 is turned OFF. When a channel of the VHF•LOW band is received, local oscillation circuit 37 is turned OFF, and local oscillation circuit 38 is set to the operative state. The IF signal is amplified by IF amplifying circuit 39, passed to SAW filter 40, amplified by IF amplifying circuit 41 and output from terminal 57.

In the present embodiment, in order to improve characteristic related to distortion of RF amplifying circuits 27 and 28, bias is set such that AGC operation for the PIN diodes 21 and 22 takes place earlier than the AGC operation for RF amplifying circuits 27 and 28. Accordingly, even when CATV signals of strong level are input, the signals can be attenuated by PIN diodes 21 and 22, and therefore strong level signals are never input to RF amplifying circuits 27 and 28. Therefore, distortion can be suppressed.

The AGC bias is set to the RF•AGC operation start point by bias resistors 42, 75 and 77. Thereafter, AGC voltage to be input to the second gate is set by bias resistors 84, 88, 86 and 90 so that AGC operation for RF amplifying circuits 27 and 28 takes place in accordance with the amount of gain attenuation of PIN diodes 21 and 22.

For example, in order that RF•AGC takes place for the CATV signal input level of 60 to 90 dbμ, PIN diodes 21 and 22 are set such that AGC operation starts at the input level of 60 dBμ. Thereafter, assuming that the amount of gain attenuation of PIN diodes 21 and 22 is −15 dB, values of bias resistors 84, 88, 86 and 90 are set such that AGC operation for RF amplifying circuits 27 and 28 starts when the input level attains to 75 dBμ.

Figure 15:
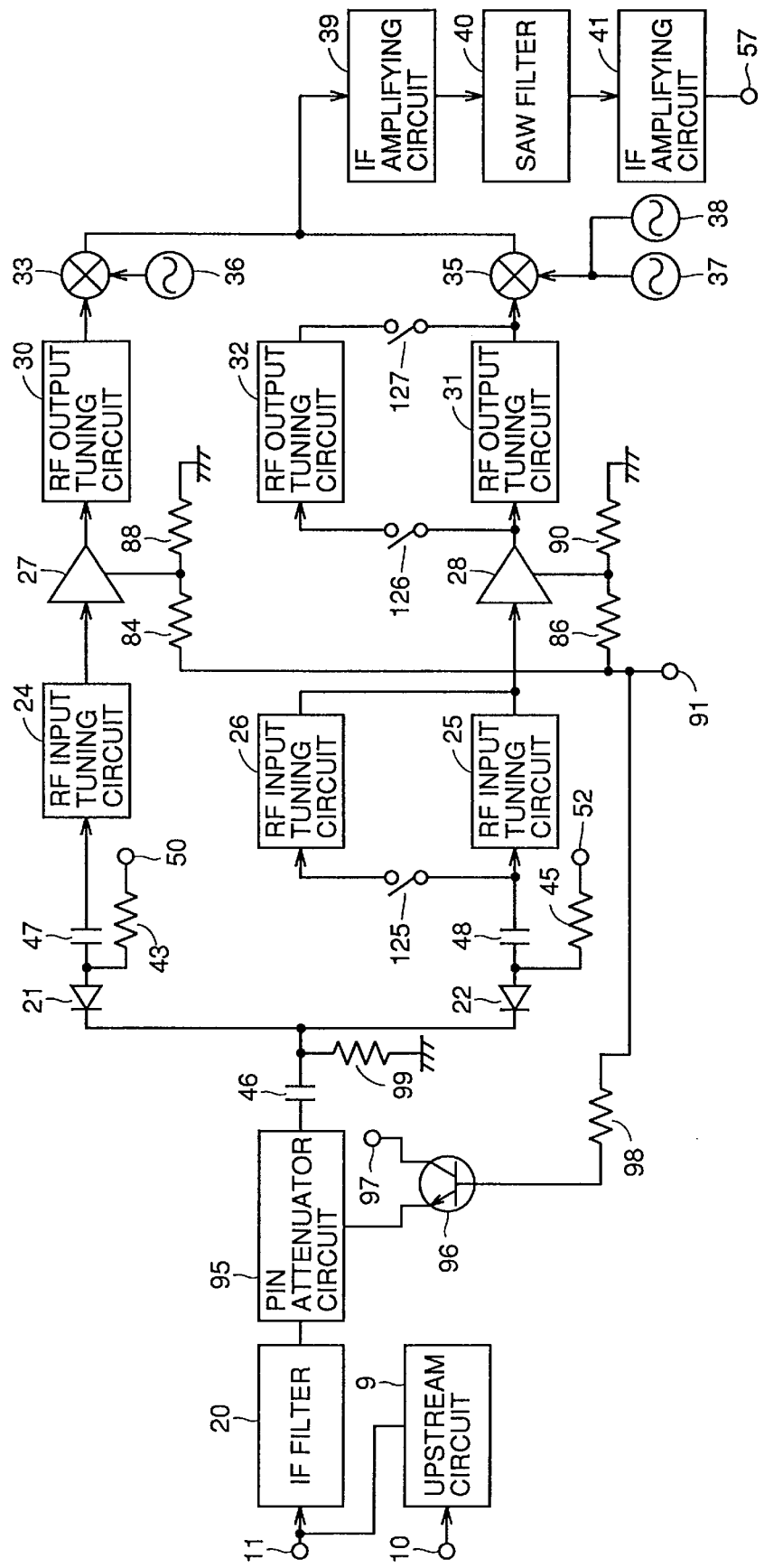
FIG. 15 is a circuit diagram showing a twelfth embodiment of the present invention.

FIG. 15 is a circuit diagram showing a twelfth embodiment of the present invention in which portions corresponding to those of FIG. 12 are denoted by the same reference characters and description thereof is not repeated. PLL channel selection circuit 18 (see FIG. 12) is not shown in FIG. 15 either, for simplicity. In the present embodiment, AGC for PIN diodes 21 and 22 is not performed. A PIN attenuator circuit 95 provided in a preceding stage of PIN diodes 21 and 22 is subjected to AGC.

PIN attenuator circuit 95 is biased from power supply terminal 97 common to all bands through an NPN transistor 96. Transistor 96 has its base connected to AGC terminal 53 through an AGC resistor 98, and its collector connected to power supply terminal 97. A bias voltage is supplied from the emitter of transistor 96 to PIN attenuator circuit 95.

PIN attenuator circuit 96 includes a PIN diode, and by controlling current flowing therethrough, high frequency resistance changes, and utilizing this characteristic, the amount of gain attenuation is controlled. AGC bias of RF amplifying circuits 27 and 28 are set in the similar manner as in the embodiment shown in FIG. 14, using resistors 84, 88, 86 and 90. Therefore, delayed AGC operation is possible in the similar manner as the embodiment shown in FIG. 14. In order to turn ON PIN diode 21, a voltage is applied from power supply terminal 50 so that current flows to bias resistors 43 and 99. In order to turn ON PIN diode 22, a voltage is applied to power supply terminal 52 so that current flows to bias resistors 45 and 99.

Figure 16:
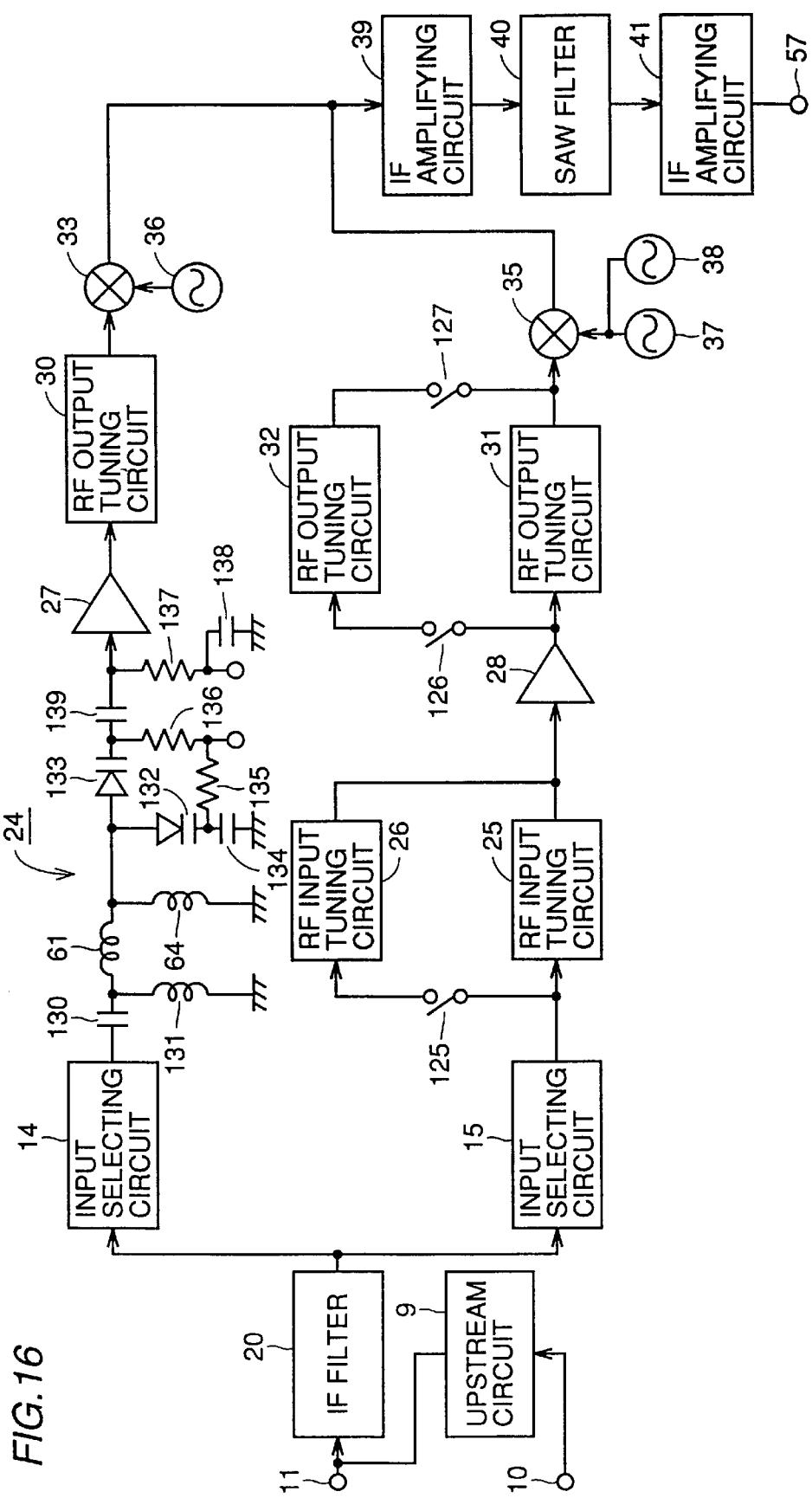
FIG. 16 is a circuit diagram showing a thirteenth embodiment of the present invention.

FIG. 16 is a circuit diagram showing a thirteenth embodiment of the present invention in which portions corresponding to those of FIG. 12 are denoted by the same reference characters and description thereof is not repeated. The present invention is directed to improvement of the RF input tuning circuit, especially to improvement in characteristics for the system of UHF band.

Referring to FIG. 16, capacitor 130 and coil 131 constitute a high pass filter having cut off frequency of 400 MHz. A coil 61 for matching impedance is provided in the succeeding stage of the high pass filter. Further, tuning coil 64, a variable capacitance diode 132, a variable capacitance diode 133 for matching, a capacitor 134 for suppressing capacitance variation ratio, bias resistors 136 and 137, a DC cut off capacitor 139 and a bypass capacitor 138 are provided.

Tuning coil 64, variable capacitance diode 132 and capacitor 134 for suppressing capacitance variation ratio constitute the tuning circuit. Coil 61 for impedance matching and variable capacitance diode 133 for matching are inserted for matching with the tuning circuit. Bias voltages to variable capacitance diodes 132 and 133 are supplied through bias resistors 135 and 136 for supplying tuning voltages, respectively. The bias voltage for RF amplifying circuit 27 is supplied through resistor 137 and bypass capacitor 138. It goes without saying that RF amplifying circuits 27 and 28 are subjected to AGC, and input selecting circuits 14 and 15 are also adapted to be subjected to AGC operation as shown in FIG. 13, for example.

Accordingly, inter modulation such as CSO and CTB can be improved by more than 15 dB, and cross modulation can be improved by more than 10 dB. Simultaneously, selectivity is improved with respect to image ratio and local oscillation signal leak, and degradation of power gain and noise figure can be suppressed.

Figure 17:
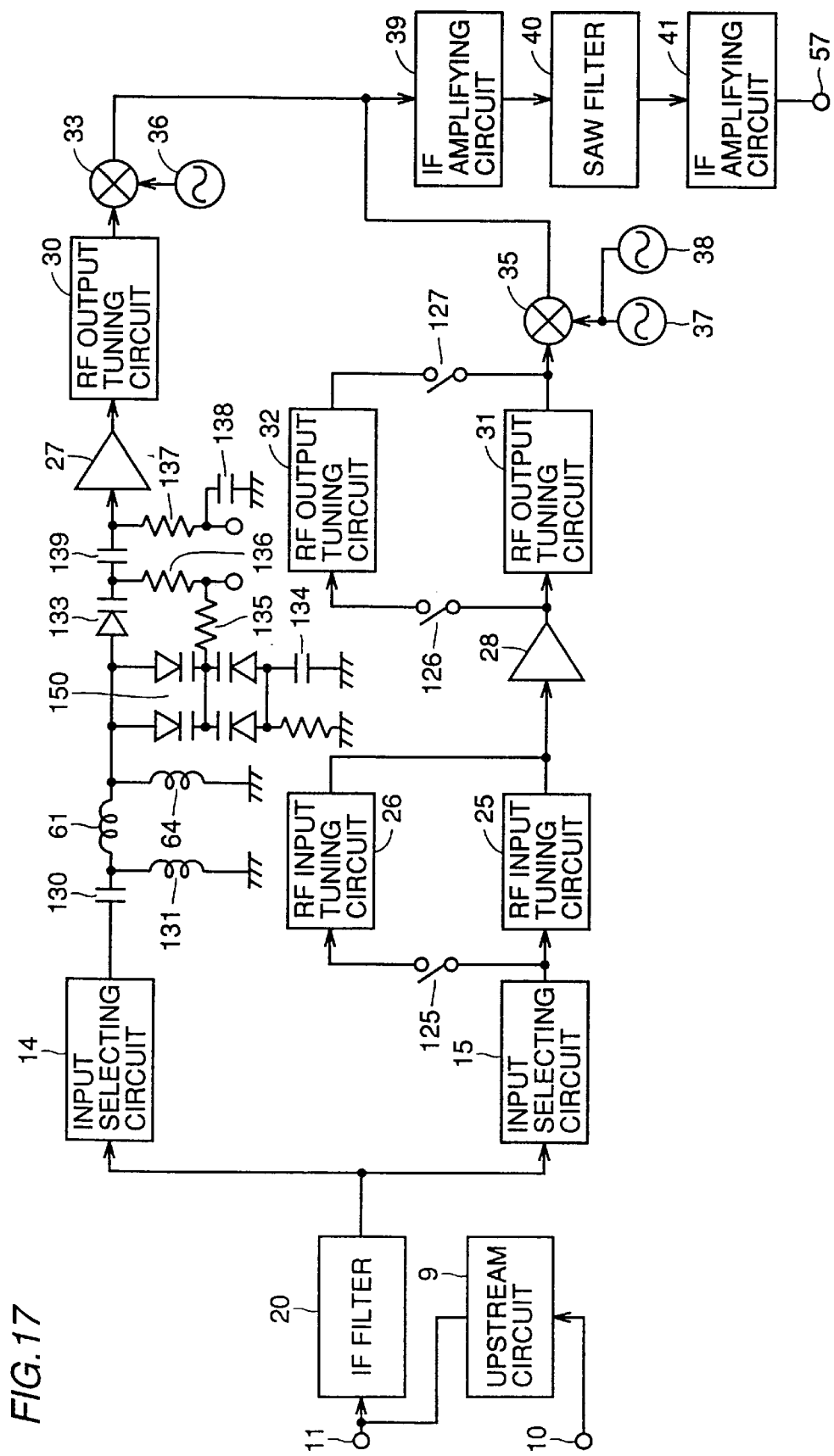
FIG. 17 is a circuit diagram showing a fourteenth embodiment of the present invention.

FIG. 17 is a circuit diagram showing a fourteenth embodiment of the present invention in which portions corresponding to those of FIG. 16 are denoted by the same reference characters and description thereof is not repeated. The present embodiment differs from the embodiment shown in FIG. 13 in that in place of variable capacitance diode 132 for tuning, a variable capacitance diode 150 is used which includes a series connection in reverse direction of parallel connected variable capacitance diodes having same characteristics.

In FIG. 16, one variable capacitance diode 132 exhibits its function. However, when multiwave CATV signals are at the high level of 75 dBμ or higher, especially when the bias applied to the variable capacitance diode is shallow, it enters a wide amplitude mode and exhibits detection function. In the present embodiment, the characteristic that when variable capacitance diodes are connected in series, the signal level applied to opposing ends of one variable capacitance diode is reduced to ½ is utilized, in order to suppress distortion. However, when variable capacitance diodes are simply connected in series, effective Q as a resonator circuit is degraded and selectivity is degraded, because of internal resistance (series resistance) of the variable capacitance diodes.

Therefore, in the present embodiment, diodes having the same characteristics are connected in parallel, and the parallel connections are connected in series. Since diodes having the same characteristics are connected in parallel, the composite resistance can be reduced to ½ of the internal resistance, while the capacitance variation ratio can be maintained the same as before the modification. According to this method, the minimum value of the tuning capacitance can be made the same as before. The variable capacitance diodes should have the same characteristics in order to prevent tracking error between the local oscillation circuit and the RF output tuning circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A tuner for a cable modem connected to an upstream side and a downstream side of a CATV station, comprising:

upstream circuit means for transmitting data to said upstream side;

filter means connected to said downstream side for removing data for said upstream side;

selecting means for dividing into at least two groups and selectively outputting input signals having different frequencies received from an output of said filter means, on frequency band basis;

at least two radio frequency tuning means for said at least two groups for tuning to predetermined frequency and amplifying each group of the received signals selected by said selecting means;

at least two frequency converting means for said at least two groups for converting an output signal from each of said radio frequency tuning means to an intermediate frequency signal;

intermediate frequency amplifying means for amplifying the signal of which frequency is converted by each of said frequency converting means;

each of said radio frequency tuning means includes;
radio frequency input tuning means for tuning the received signals selected by said selecting means to a predetermined frequency,
radio frequency amplifying means for amplifying an output signal from said radio frequency input tuning means, and
radio frequency output tuning means for tuning an output signal from said radio frequency amplifying means to a predetermined frequency;

said selecting means selectively outputs two groups of received signals belonging, of a first frequency band, a second frequency band having higher frequency than said first frequency band and a third frequency band having higher frequency than said first and second frequency bands, to said first and second frequency bands, and to signal based on the local oscillation signal generated by said local oscillation means; and the radio frequency input tuning means for said third frequency band includes a tuning circuit including a high pass filter, a tuning coil, a variable capacitance element for tuning and a tuning voltage applying circuit for applying a tuning voltage to the variable capacitance element for tuning, a variable capacitance element for impedance matching, and bias means for supplying a bias voltage to the radio frequency amplifying means of a succeeding stage through a resistor;

wherein said variable capacitance element including parallel-connected variable capacitance diodes of identical characteristics connected in series to parallel-connected variable capacitance diodes in opposite directions.

2. A tuner for a cable modem connected to an upstream side and a downstream side of a CATV station, comprising:

upstream circuit means for transmitting data to said upstream side;

filter means connected to said downstream side for removing data for said upstream side;

selecting means for dividing into at least two groups and selectively outputting input signals having different frequencies received from an output of said filter means, on frequency band basis;

at least two radio frequency tuning means for said at least two groups for tuning to predetermined frequency and amplifying each group of the received signals selected by said selecting means;

at least two frequency converting means for said at least two groups for converting an output signal from each of said radio frequency tuning means to an intermediate frequency signal;

intermediate frequency amplifying means for amplifying the signal of which frequency is converted by each of said frequency converting means;

said selecting means selectively outputs three groups of received signals belonging to a first frequency band, a second frequency band of higher frequency than said first frequency band and a third frequency band having higher frequency than said first and second frequency bands, respectively, said radio frequency amplifying means and said frequency converting means include three said high frequency amplifying means and three said frequency converting means corresponding to the received signals of said first to third frequency bands, respectively;

each of said radio frequency input tuning means for said first and second frequency bands includes;

a double tuning type input circuit, an impedance matching element for attaining impedance matching with an adjacent circuit, and bias means for applying a bias voltage to the radio frequency amplifying means of a succeeding stage through a resistor, said double tuning type input circuit includes a first resonator circuit including a first tuning coil and a first variable capacitance element, a second resonator circuit including a second tuning coil coupled to said first tuning coil and a second variable capacitance element, tuning voltage applying means for applying a tuning voltage to said first and second variable capacitance element;

wherein said variable capacitance element including parallel-connected variable capacitance diodes of identical characteristics connected in series to parallel-connected variable capacitance diodes in opposite directions.

3. A tuner for a cable modem connected to an upstream side and a downstream side of a CATV station, comprising:

upstream circuit means for transmitting data to said upstream side;

filter means connected to said downstream side for removing data for said upstream side;

selecting means for dividing into at least two groups and selectively outputting input signals having different frequencies received from an output of said filter means, on frequency band basis;

at least two radio frequency tuning means for said at least two groups for tuning to predetermined frequency and amplifying each group of the received signals selected by said selecting means;

at least two frequency converting means for said at least two groups for converting an output signal from each of said radio frequency tuning means to an intermediate frequency signal;

intermediate frequency amplifying means for amplifying the signal of which frequency is converted by each of said frequency converting means;

each of said radio frequency tuning means includes;

radio frequency input tuning means for tuning the received signals selected by said selecting means to a predetermined frequency, radio frequency amplifying means for amplifying an output signal from said radio frequency input tuning means, and radio frequency output tuning means for tuning an output signal from said radio frequency amplifying means to a predetermined frequency; and matching means including an impedance matching variable capacitance element for performing impedance matching between a tuning signal from a tuning signal from a tuning circuit and a circuit of a succeeding stage.

4. A tuner for a cable modem connected to an upstream side and a downstream side of a CATV station, comprising:

upstream circuit means for transmitting data to said upstream side;

filter means connected to said downstream side for removing data for said upstream side;

selecting means for dividing into at least two groups and selectively outputting input signals having different frequencies received from an output of said filter means, on frequency band basis;

at least two radio frequency tuning means for said at least two groups for tuning to predetermined frequency and amplifying each group of the received signals selected by said selecting means;

at least two frequency converting means for said at least two groups for converting an output signal from each of said radio frequency tuning means to an intermediate frequency signal;

intermediate frequency amplifying means for amplifying the signal of which frequency is converted by each of said frequency converting means;

each of said radio frequency tuning means includes;

radio frequency input tuning means for tuning the received signals selected by said selecting means to a predetermined frequency, radio frequency amplifying means for amplifying an output signal from said radio frequency input tuning means, radio frequency output tuning means for tuning an output signal from said radio frequency amplifying means to a predetermined frequency;

said radio frequency amplifying means includes a dual gate MOSFET having first and second gates, said first gate receiving the output signal from said radio frequency input tuning means, and said second gate receiving an automatic gain control voltage for controlling gain, and a variable capacitance element including two parallel-connected variable capacitance diodes connected in series to two parallel-connected variable capacitance diodes of identical characteristics in opposite directions, connected to the tuning circuit.

\* \* \* \* \*